US011302830B2

(12) United States Patent
deVos

(10) Patent No.: US 11,302,830 B2
(45) Date of Patent: Apr. 12, 2022

(54) APPARATUS FOR FORMING A NANOSTRUCTURED THIN FILM WITH POROSITY GRADIENT ON AN ARRAY OF SLOPED OUTDOOR PANEL SURFACES USING MENISCUS DRAG

(71) Applicant: John Arthur deVos, Corvallis, OR (US)

(72) Inventor: John Arthur deVos, Corvallis, OR (US)

( * ) Notice: Subject to any disclaimer, the term of this patent is extended or adjusted under 35 U.S.C. 154(b) by 0 days.

(21) Appl. No.: 16/587,307

(22) Filed: Sep. 30, 2019

(65) Prior Publication Data

US 2020/0206771 A1 Jul. 2, 2020

(51) Int. Cl.
*B05C 1/06* (2006.01)
*B05C 1/16* (2006.01)
(Continued)

(52) U.S. Cl.
CPC ...... *H01L 31/02168* (2013.01); *B05B 7/0093* (2013.01); *B05B 12/004* (2013.01); *B05C 1/06* (2013.01); *B05C 1/16* (2013.01); *B05C 5/027* (2013.01); *B05C 5/0291* (2013.01); *B05D 1/02* (2013.01); *B82Y 30/00* (2013.01); *B82Y 40/00* (2013.01); *C03C 17/25* (2013.01); *C09D 5/006* (2013.01); *C09D 7/20* (2018.01); *C09D 7/61* (2018.01); *C09D 7/67* (2018.01); *C09D 183/04* (2013.01); *E06B 9/24* (2013.01); *F24S 70/30* (2018.05); *G01N 21/6489* (2013.01); *G02B 1/11* (2013.01); *H01L 31/0481* (2013.01); *C03C 17/002* (2013.01); *C03C 17/007* (2013.01); *C03C 17/009* (2013.01);
(Continued)

(58) Field of Classification Search
None
See application file for complete search history.

(56) References Cited

U.S. PATENT DOCUMENTS 4,456,379 A 6/1984 Schumann et al.
4,822,194 A * 4/1989 Simonette ............... B05C 1/06
15/144.1
(Continued)

OTHER PUBLICATIONS

Office Action prepared by the U.S. Appl. No. 16/587,633, dated Jan. 8, 2021, 21 pages.
International Search Report and Written Opinion prepared by the US Receiving Office for PCT/US2020/053410, dated Jan. 11, 2021, 13 pages.
(Continued)

*Primary Examiner* — Binu Thomas
(74) *Attorney, Agent, or Firm* — Chernoff, Vilhauer, McClung & Stenzel, LLP

(57) ABSTRACT

A thin-film coating applicator assembly is disclosed for coating substrates in outdoor applications. The innovative thin-film coating applicator assembly is adapted to apply performance enhancement coatings on installed photovoltaic panels and glass windows in outdoor environments. The coating applicator is adapted to move along a solar panel or glass pane while applicator mechanisms deposit a uniform layer of liquid coating solution to the substrate's surface. The applicator assembly comprises a conveyance means disposed on a frame. Further disclosed are innovative applicator heads that comprise a deformable sponge-like core surrounded by a microporous layer. The structure, when in contact with a substrate surface, deposits a uniform layer of coating solution over a large surface.

7 Claims, 28 Drawing Sheets

(51) Int. Cl.
| | |
|---|---|
| H01L 31/0216 | (2014.01) |
| G02B 1/11 | (2015.01) |
| F24S 70/30 | (2018.01) |
| C09D 5/00 | (2006.01) |
| C09D 7/61 | (2018.01) |
| C09D 7/40 | (2018.01) |
| C09D 7/20 | (2018.01) |
| C09D 183/04 | (2006.01) |
| B05D 1/02 | (2006.01) |
| B05C 5/02 | (2006.01) |
| B82Y 30/00 | (2011.01) |
| B82Y 40/00 | (2011.01) |
| G01N 21/64 | (2006.01) |
| H01L 31/048 | (2014.01) |
| B05B 7/00 | (2006.01) |
| B05B 12/00 | (2018.01) |
| C03C 17/25 | (2006.01) |
| E06B 9/24 | (2006.01) |
| C03C 17/00 | (2006.01) |

(52) U.S. Cl.
CPC .... *C03C 2217/73* (2013.01); *C03C 2218/113* (2013.01); *C03C 2218/118* (2013.01); *E06B 2009/2417* (2013.01)

(56) References Cited

U.S. PATENT DOCUMENTS

| | | | |
|---|---|---|---|
| 4,887,771 A | 12/1989 | Marlek | |
| 10,010,902 B2 | 7/2018 | deVos et al. | |
| 10,574,180 B2 | 2/2020 | DeVos | |
| 2006/0118136 A1* | 6/2006 | Manor | B08B 1/04 134/6 |
| 2009/0266353 A1* | 10/2009 | Lee | B08B 1/008 126/593 |
| 2010/0000570 A1* | 1/2010 | Mertins | B08B 1/008 134/6 |
| 2012/0125367 A1* | 5/2012 | Monkman | B08B 1/04 134/18 |
| 2013/0169966 A1 | 7/2013 | Shchegrov et al. | |
| 2013/0206173 A1* | 8/2013 | Zijlstra | B08B 1/04 134/6 |
| 2013/0306106 A1* | 11/2013 | Meller | B08B 5/02 134/6 |
| 2015/0015959 A1 | 1/2015 | Lee et al. | |
| 2016/0114352 A1* | 4/2016 | deVos | B05C 1/06 427/553 |
| 2017/0008022 A1* | 1/2017 | deVos | B05C 5/0258 |
| 2017/0121531 A1 | 5/2017 | Han | |
| 2020/0105949 A1 | 4/2020 | deVos | |

OTHER PUBLICATIONS

Final Office Action prepared by the US Patent and Trademark Office for U.S. Appl. No. 16/587,633, dated Jul. 27, 2021, 24 pages.

\* cited by examiner

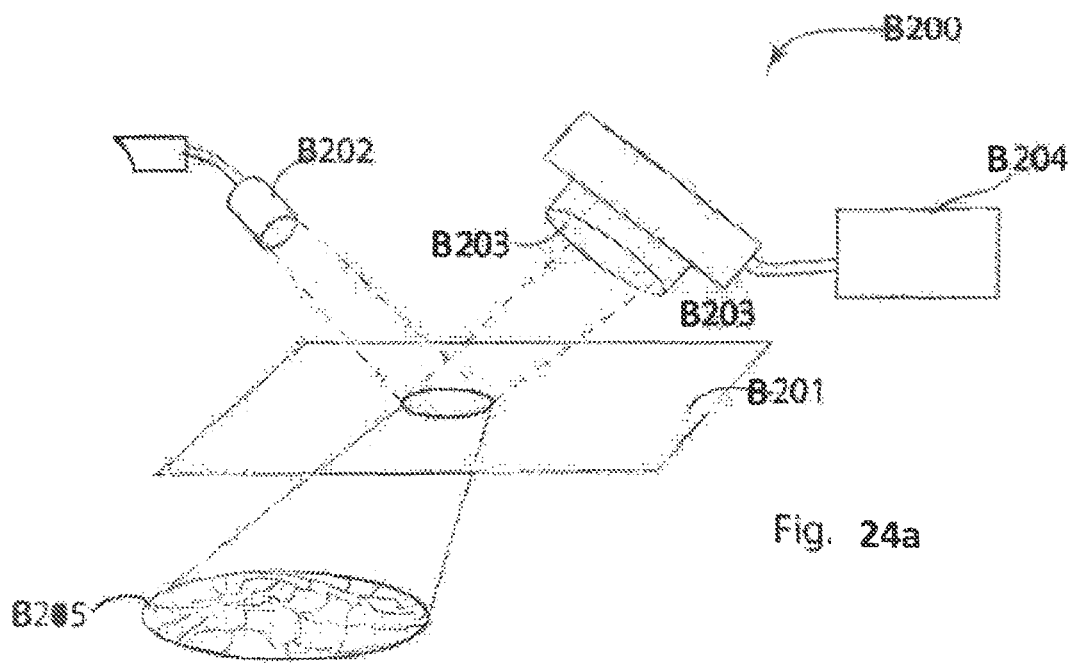
Fig. 24a
Fig. 24b
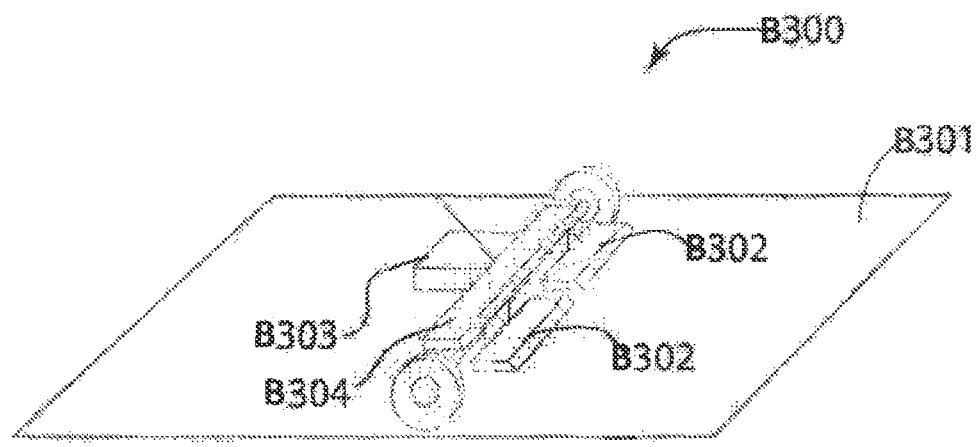
Fig. 25

APPARATUS FOR FORMING A NANOSTRUCTURED THIN FILM WITH POROSITY GRADIENT ON AN ARRAY OF SLOPED OUTDOOR PANEL SURFACES USING MENISCUS DRAG

CROSS REFERENCES TO RELATED APPLICATIONS

This application refers and includes material from U.S. Pat. No. 10,010,902 filed on Sep. 26, 2016 entitled "Thin-film coating apparatus for applying enhanced performance coatings on outdoor substrates", and U.S. Pat. No. 10,574,180 filed on May 15, 2016 entitled "Sensor for Measuring Reflected Light for Optimizing Deposited Performance Enhancement Coatings on Substrates", and U.S. patent application Ser. No. 15/129,403 filed on Sep. 26, 2016 entitled "Low Temperature Curable Energy Transmission Enhancement Coatings Having Tunable Properties Including Optical, Hydrophobics and Abrasion Resistance", the disclosures of which are hereby incorporated by reference in their entirety.

FIELD OF THE INVENTION

This invention relates to the application of nanostructured thin films on outdoor surfaces.

BACKGROUND

Silicon photovoltaic panels typically have a protective top layer of cover glass or plastic to protect the underlying photovoltaic cells. Enhanced performance coatings such as thin-film energy transmission improvement layers in the form of antireflective coatings on the top surface of the cover glass or plastic protective layer is desirable from the standpoint of increasing solar cell efficiency. Such films improve the transmission of infrared, visible and ultraviolet wavelengths of light through the cover glass or plastic protective layer, typically by providing a refractive index gradient to better capture incident light energy that otherwise would be reflected from the surface of the cover glass or plastic protective layer. Enhanced transmission of light energy to photovoltaic cells provides an advantage by increasing the number of photons available for electricity production. Energy transmission improvement coatings, again in the form of antireflective coatings, may also provide an advantage for glass windows by reducing the light reflected off of the surface, reducing the glare normally emanating from glass surfaces. Increased energy transmission, in the form of increasing the number of photons transmitted through the glass from outside a building to the inside of the building, may also reduce the need for interior electric lighting. Both photovoltaic panel cover glass and window glass are typically large and require even coatings of uniform thickness to be effective.

Thin film coating technologies have been developed and perfected for industrial scale production in window and solar panel manufacturing. As it has become known that thin-film antireflective coatings improve solar cell efficiencies, it has become desirable to now manufacture solar photovoltaic panels with such coatings in recent years. However, retrofitting older panels not originally coated with antireflective coatings requires dismantling of the photovoltaic array and sending the individual panels to a factory or facility for coating, an expensive and disruptive endeavor. Similarly for glass window panes installed on commercial buildings and storefronts, many may benefit from an antiglare coating, but are already installed and would need to be replaced with new pre-coated window panes, or by installing anti-glare sheets on the pane. Currently, there are no viable, cost effective solutions for retrofitting photovoltaic panels and window panes with high quality thin-film coatings.

Currently available light reflection sensors are not capable of measuring the light reflection from a relatively large spot size on the top surface of solar panels installed in the field and comparing the results before and after application of a performance enhancement coating. The very small spot size analyzed by a typical sensor using a fiber optic probe is insufficient to accurately measure in one reading an area large enough to determine the average performance across the whole solar panel of solution deposited performance enhancing coatings. This is due in part because variations in the top surface structure of solar panel cover glass and variations in solution deposited coating may not be adequately represented within the very small spot size read by the fiber optic probe. Multiple readings by such a probe would have to be done to develop a statistically significant number of samples to estimate average coating performance.

Furthermore, typical fiber optic probe sensors require the use of a separate computing device, such as a laptop computer, to run the calculations required to produce human readable data. The process of taking numerous measurements and transporting and setting up a typical fiber optic sensor with a separate computing device for each solar panel to be measured is relatively cumbersome and time consuming compared with a device with integrated computing and human readable display that can determine the average performance difference in light reflection properties by taking just one measurement before and just one measurement after application of a performance enhancement coating.

Energy transmission enhancement coatings are thin-film dielectric optical coatings that augment the transmission of infrared, visible and ultraviolet light to surfaces of transparent and non-transparent substrates. Enhanced transmission of light energy to photovoltaic cells provides an advantage by increasing the number of photons available for electricity production. Energy transmission improvement coatings, again in the form of antireflective coatings, may also provide an advantage for glass windows by reducing the light reflected off of the surface, reducing the glare normally emanating from glass surfaces. Increased energy transmission, in the form of increasing the number of photons transmitted through the glass from outside a building to the inside of the building, may also reduce the need for interior electric lighting. Such coatings serve to reduce reflected light, and increase transmission by acting as a refractive index-matching layer, forming a gradient of refractive index from that of air to that of the substrate, within a layer approximately ¼ wavelength in thickness, where the wavelength band of light may be chosen by adjusting the thickness and the material of the coating. Thin dielectric films formed on a reflective surface can provide a refractive index match between the substrate and the surrounding medium, typically air, if the film has a refractive index intermediate between the substrate and air. In addition, a thin film necessarily presents more than one reflective interface from which incident light can reflect to create destructive interference conditions suppressing the light reflected from each interface.

Anti-reflective (AR) thin films or coatings are examples of such energy transmission enhancement coatings To this day, the optical principles originally laid out by Rayleigh and others to explain the AR effect govern the design objectives of modern engineered AR thin film coatings. Modern thin-film deposition methods and nanotechnology are employed to produce advanced coatings. Present commercial coatings comprise both single and multilayer coatings, which may be deposited by so-called dry deposition techniques, such as RF sputtering or vapor deposition techniques (i.e., magnesium fluoride), or by wet methods. Sol gel methods are particularly used as wet deposition techniques, and are able to be carried out in non-laboratory environments, do not require expensive high-vacuum systems, and use inexpensive starting materials.

Recent efforts have produced advanced AR coatings, and optical coatings in general, where attention is paid to optimizing mechanical properties as well as optical properties. Examples of improved AR coatings are abundant in many recently published patent applications and issued patents. These more advanced coatings rely on multilayer wet deposition comprising an adhesion layer, followed by one or more engineered optical layers that are by themselves mechanically weak. By focusing on optimizing optical properties, many commercial AR coatings suffer from inferior mechanical properties, such as low abrasion resistance, brittleness, short lifespan and low thermal/chemical stability.

Many optical layers for use as AR coatings may comprise nanoparticles, particularly hollow nanoparticles to effectively provide a nanoporous medium of low refractive index for improved reflection suppression. Furthermore, the optical layers may be capped by a protective layer to ensure mechanical protection of the entire coating from environmental stresses experienced by the substrate. Some of these protective layers feature organo-silicate cross-linking components combined with silicate-based sol gels to form the protective layers. In all cases, the manufacture of multiple layer coatings is inherently more expensive and complicated in comparison to application of a single layer. [0006], In many coating processes, curing temperatures for producing optical coatings such as AR coatings are typically carried out well above 100° C., typically over 500° C., to have a reasonable curing times. This may limit or preclude the production of scratch-resistant AR coatings on delicate substrates, or heat-sensitive substrates made from polymers, layered semiconductor photovoltaic structures, and low melting metals, such as aluminum. Furthermore, the high curing temperatures preclude the possibility of applying optical coatings outside of a manufacturing environment, where specialty ovens or heat treating assembly lines are necessary to applying and baking optical coatings on large substrates such as photovoltaic panels. Efforts have been made to make available less expensive liquid sol-gel coating precursor solutions for panel manufacture, and in recent years many new panels are produced with AR coatings.

In many cases, older photovoltaic and solar thermal panels that do not have an AR coating have been part of a working installation, such as a multi-panel solar array, for a number of years. As such panels have many years of service lifetime left, it may be desirable to retrofit these panels with the newer sol-gel optical coatings, such as AR coatings, taking advantage of their lower costs, to increase the solar energy conversion efficiencies by 3-4 percentage points. Over time for large arrays, these small increases in conversion efficiency translate to significant increases in profit margins for commercial operations. However, the curing conditions required by present day commercially available sol-gel coating precursor solutions involve high temperature baking regimes of approximately 200° C. to over 500° C. in order to produce sufficiently robust optical coatings. These high-temperature conditions thus require dismantling of the installation in order to deliver the panels to a special facility or return them to the factory of origin to reprocess the panels with the optical coatings. The endeavor is highly disruptive and costly both in downtime and processing costs. Ideally, the panels could be coated on site, without the need to dismantle them and ship them off-site. If a low-temperature curing formulation could be developed, whereby the heat of the sunlight captured by the substrate can be harnessed to cure a precursor sol-gel solution to high quality optical coatings in a relatively short time, on panels in an existing outdoor installation. As an example, sun-curing at ambient air temperatures ranging from 10° C. to 40° C. combined with incident solar radiation can heat the surface of the substrate to temperatures ranging from about 30° C. to over 100° C. For such an application, a low-temperature curable coating composition that results in a highly robust optical coating is required, where in addition to the low-temperature curability, the resulting coating film has very high abrasion durability, humidity resistance, and high optical transmittance over a large spectral range.

No examples are currently available describing a single layer optical coating having both optimized optical and mechanical characteristics and that cures at temperatures less than 100° C. Moreover, no example of an optical coating method or process exists to produce a single layer optical coating with tuned optical, mechanical and chemical properties on demand, whereby the important properties can be easily tuned to meet the environmental demands of the substrate.

SUMMARY OF THE INVENTION

Herein is described an apparatus for forming a nanostructured thin film with a porosity gradient on an array of sloped panel surfaces outdoors. The meniscus drag mechanisms may be considered alternate embodiments of, or a subset of, the coating applicator heads described below.

Combinations of material may include, but not be limited to the following:

Incorporation of the deformable porous core and capillary interface layers with the meniscus drag mechanism.

Combination of the surface conforming means and mechanisms and force absorbing and leveling means and mechanisms with the meniscus drag mechanism and/or applicator.

Integration of adjustable width support structures and one or more meniscus drag mechanisms to enable compatibility with different width panels.

Incorporation of one or more pump, tubing and manifold or plenum embodiments and the meniscus drag mechanism.

Integration of mechanisms and methods shown below with the mechanisms and methods also shown below.

Incorporation of the control loop feedback means and mechanisms for controlling the applicator, meniscus drag mechanisms and/or coating deposition method and/or processes.

Combination of the reflection sensor, photo-detector, and/or spectrometer means and mechanisms with the reflection sensing device.

Incorporation of the various embodiments of the single-layer energy transmission enhancement coating of into coating deposited by the applicator.

Integration of one or more of the various curing means of the single-layer energy transmission enhancement coating into the apparatus and/or method of forming a nanostructured thin film.

Incorporation of the mechanisms, means and methods for tuning the coating into the mechanisms, means and methods of forming a nanostructured thin film.

Incorporation of one or more of the constituents in the formulation into the coating solution and/or nanostructured thin film.

Incorporation of the durability, robustness and/or performance characteristics of the coating into the nanostructured thin film.

The invention described herein is an apparatus for forming a nanostructured thin film with a porosity gradient on an array of sloped panel surfaces outdoors. The apparatus comprises an applicator which translates across the array of sloped outdoor panel surfaces and uses meniscus drag deposition to deposit onto the sloped outdoor panel surfaces a solution comprising various solvents and amorphous silica which then forms a nanostructured thin film with a porosity gradient dependent at least in part on the evaporation of the various solvents.

The innovation described herein is a novel portable coating apparatus for applying performance enhancement coatings to the surfaces of utilitarian substrates such as photovoltaic (solar) panels, glass windows, and the like, used outdoors or inside buildings. Embodiments of the innovative coating apparatus comprise manually controlled and autonomous portable coating assemblies, wherein the entire assembly, or a portion thereof, is adapted to travel, translate, or otherwise be conveyed along a substrate surface while spreading an even and uniform layer of a liquid coating solution, which then cures to form a solid coating layer. The coating may be an optical coating, as, for example, an anti-reflective coating, advantageous for increasing efficiencies of photovoltaic panels and solar thermal panels, or reducing glare from glass window panes.

It is a primary object of the innovation described herein to provide a facile means of applying coatings of field installations of substrates post-manufacture, as, for example, an array of photovoltaic panels installed outdoors at a power generation facility, an array of solar thermal panels installed on a building roof or in another outdoor location, and the like. As coatings such as anti-reflective coatings are proven to increase efficiencies of photovoltaic panels in particular and have begun to gain wide acceptance in recent years, it may be advantageous to retrofit older panels already deployed in installations with such coatings; however, present coating systems are stationary apparatuses for use in a manufacturing facility, for example, and the current post-manufacture coating protocol requires the dismantling of a photovoltaic (or other) array and sending the panels to a facility to have the coating done. This is obviously expensive and disruptive, where the costs of going this route may outweigh the efficiencies gained by the coating, at least in the short term. The instant innovation provides a desirable solution to this dilemma, whereby a portable coating system is provided having the ability to traverse the surface of a panel substrate and deposit a high-quality coating across the entire surface of the substrate. By high quality, it is understood that the films deposited by the instant innovation are substantially uniform in thickness across the substrate.

To achieve such uniformity in coating thickness, the instant innovation is adapted to be placed on or over a panel substrate, and then to cause the coating mechanism to traverse the panel while spreading the coating solution at a substantially constant deposited volume per panel substrate unit area. For some coating applications, some embodiments of the instant innovation may comprise a portable coating assembly adapted for coating installed panel substrates of the type described above, wherein the portable coating assembly comprises a support structure having dimensions that are compatible with panel dimensions (e.g., the width of the support structure is compatible with the width of the panel). Some portable coating assembly embodiments may further comprise one or more coating applicator mechanisms or structures and a conveyance mechanism that is adapted to move the one or more coating applicator mechanisms along their trajectory on the surface of the panel substrate.

The inventive portable coating assembly further comprises one or more innovative coating applicator mechanisms affixed to the support structure. In some embodiments, the support structure may take the form of a platform. The coating applicator mechanisms comprise a means to deposit the coating solution on the surface of the substrate, said means including, but not limited to spray heads, rollers, slots, brushes, doctor blades, wipers, draw-bars, sponges, foam, porous textile layer or a combination of such.

In some embodiments, the coating applicator mechanisms comprise one or more applicator heads, each of which further comprises a deformable core body, composed of a compliant and deformable material, and a microporous "skin", or interface layer having a certain micropore volume sufficient to hold a determined amount of liquid coating solution and contacting a portion of the surface of the deformable core body. The deformable core body may also be porous in nature and serve the function of an additional reservoir for a liquid coating solution, and the microporous layer serves the function of an interface between the deformable core body and the substrate surface, whereby the micropores act as a capillary array to transfer coating solution to the substrate. In some embodiments, a textile such as a felt fabric may be used as the microporous interface layer. Felt fabrics have a large plurality of fibers oriented randomly within the fabric, where the interstitial spaces between the fibers present an extensive array of tortuous micropores.

Moreover, felts can be fabricated from a large variety of fibers to virtually any thickness, and have very fine and soft textures ideal for uniform spreading of liquids on surfaces. The soft and compliant nature of felts make them ideal for use as a microporous interface layer. In addition to felts, other fabrics and materials may be used for the same purpose (e.g. woven sheet and high porosity foam). The micropores of the felt interface or an interface created by other materials effectively act as an array of capillaries that store and transfer liquid coating solution to the surface in a manner that is substantially uniform over the contact surface of the applicator head or other suitable coating mechanism. As coating solution is depleted in the microporous interface layer, in one embodiment where the deformable core is also porous and contains coating solution, the microporous interface layer may draw coating solution from the deformable core and transfer it to the substrate surface. In another embodiment, coating solution may be pumped from a reservoir through one or more tubes to the microporous interface layer before or during the coating process.

The instant innovation includes manually guided and automated embodiments, and combinations thereof. Manually guided embodiments of the instant innovation comprise the support structure and coating mechanism assembly discussed above, further comprising a handle extension of the support structure that may be rigid or bendable, where the latter may comprise springs in the handle to compensate for variations in hand-applied pressure, which can lead to non-uniformities in coating thickness. Handles may also be pivotally attached to the inventive portable coating assembly, providing ergonomic deployment of the invention. Automated embodiments may comprise mechanized or robotic coating assembly versions, whereby the support structure and coating mechanism assembly may further comprise a conveyance mechanism comprising a motorized drive.

An example of this type of embodiment is an electric motor affixed to the support structure, and coupled to a roller axel via a chain, belt or a gear train, whereby the roller axle may be connected to wheels or other devices to convey the coating assembly across the substrate. The electric motor may be controlled by an electronic motor control circuit in some embodiments. In other embodiments, the electronic motor control circuit programmable, and in yet further embodiments may also be capable of wireless control and programming. As an example, the motor serves the function of driving the innovative portable coating assembly at a constant speed to enable deposition of coatings having substantially uniform thicknesses in one embodiment. As a further example, if a thickness gradient is desired across the substrate, the motor can be programmed to ramp the speed of the assembly in another embodiment. In a still further embodiment, a ramped or variable speed may also be desired for maintaining a substantially uniform coating thickness in possible embodiments where the coating solution flow rate is also ramped or variable.

In automated embodiments, the electronic motor control circuit may also receive input from sensors that measure parameters that may correlate with the motor speed necessary to maintain a substantially uniform thickness. Such measured parameters may include ambient temperature, ambient humidity, or amount of light reflection from the coated surface. The electronic motor control circuit may then use these measured parameters to adjust the motor speed. In this way, a substantially uniform coating thickness may be maintained even if the measured parameters may change over time.

In some embodiments, the effective width of the support structure is sufficient to span the width of a panel substrate, requiring only a single excursion of the innovative portable coating assembly in one direction along the length of the substrate to deposit the coating, simplifying the coating process. In other embodiments, a motorized drive mechanism may translate the coating applicator mechanism both lengthwise and widthwise across the substrate in a grid fashion or other motion, for example, when coating areas are wider than the width of the support structure. In other embodiments, the effective width of the support structure is adjustable to span the width of substrates of non-standardized widths. Related to this aspect, manual, partially automated or fully automated embodiments may include an elongated handle for manual placement and removal of the innovative portable coating assembly on a substrate. The elongated handle provides extended reach, and as such may have ergonomic value.

Moreover, the handle may be pivotally affixed to the support structure, providing further ergonomic value. In other embodiments, the support structure may be positioned on to or translated across the substrate by a robotic arm. In yet other embodiments, the support structure may be autonomously translated across the substrate by an on-board motor without the use of a handle or robotic arm to guide it. In yet other embodiments, a combination between manually guided and automated functions may include a handle whereby the operator may help control any motion in an axis orthogonal to the direction of coating while the automated motorized functions may guide the portable coating assembly in the direction of coating. In yet further embodiments, a cabled translation mechanism may be employed.

It is a further objective of the innovation to provide coatings of uniform thickness. For embodiments comprising one or more coating heads, each of which further comprises a deformable core body, the degree of deformation may be a function of the weight of the entire assembly supported by the coating heads when engaged with the surface to be coated, as well as other vertical forces imposed on the innovative assembly. The weight of the portable coating assembly may also be supported in part by the conveyance mechanism. The deformation may furthermore pressurize any liquid contained within the microporous interface layer, and if a porous deformable core body is used, any liquid contained within the porous deformable core body as well, increasing the flux of the liquid when discharged to the substrate surface during the coating process.

While the weight of the portable coating assembly may remain substantially constant during the coating process, fluctuations in vertical forces, for instance, those due to changes in hand or arm pressure fluctuations that may occur when the portable coating assembly is manually guided during the excursion in manual embodiments, may cause fluctuations in deposition rate of the coating. Therefore, random variations in coating thickness result, if measures are not taken to mitigate these fluctuations. In some embodiments, coating mechanisms may be attached to the support structure by force-absorbing strut members responsive to changes in vertical force, mitigating them to various extents. In one type of embodiment, the struts are in the form of leaf springs. In other embodiments, struts comprise spring-loaded articulating joints interposed between elongated members, rigid or non-rigid. In yet further embodiments, struts may be in the form of a shock-absorbing dashpot mechanism, or simple compression springs.

The spring constants, or stiffness, of the various types of strut spring components may be chosen to cause the spring to deform sufficiently in response to the magnitude of changes in applied force. The struts then may absorb or at least partially absorb force fluctuations or redistribute and mitigate these force fluctuations over time before these are transferred to the deformable porous core bodies of the coating mechanisms, causing fluctuations in the geometry and therefore the pressure on the liquid contained within. As mentioned above, these changes translate to variations in the flux of coating solution being discharged from the porous core or the microporous interface layer, ultimately resulting in variations in coating film thickness.

In the embodiments described in the preceding paragraph, the force-absorbing struts connect the coating heads to the support structure. In alternative embodiments, struts may connect the conveyance device to the support structure, whereas the coating mechanisms may be either suspended by more rigid members, or again connected by force-absorbing members. In other embodiments, the coating mechanisms may be connected to the support structure by means of hinged brackets or slides which minimize the transfer of vertical forces from the support structure to the coating heads during the coating process.

In some embodiments, coating solution may be charged to the one or more coating heads in a continuous or discontinuous manner, for instance by an on-board pumping system, and in other embodiments, the coating heads are charged continuously or discontinuously by an offline means. Reducing complexity, weight and expense of the innovative portable coating assembly, offline transfer of coating solution to the coating head or heads is a preferable solution, whereby the pumping system and coating solution reservoir is eliminated from the assembly. To this end, a separate charging or re-filling station may be provided. In one embodiment, a charging station comprises a frame or superstructure, a dosing platform, a receiving structure to place the innovative portable coating assembly, whereby the receiving structure is adapted to position the coating heads of the innovative portable coating assembly on the dosing platform. Other methods of charging the coating heads are embodied by continuous and intermittent on-board or off-board pumping systems.

In addition to anti-reflective coatings, this invention may be used to deposit other performance enhancement coatings, including wave-length shifting coatings and filter coatings such as "Low-E" coatings that minimize the transmission of either ultraviolet light or infrared light or both. In other embodiments, the performance enhancement coating may be a multi-functional coating, providing a combination of two or more functions, including, but not limited to anti-reflection, wavelength shifting, filtering of ultraviolet or infrared or both, anti-soiling, self-cleaning or thermal energy management.

The innovation described herein is a novel portable coating apparatus for applying performance enhancement coatings to the surfaces of utilitarian substrates such as photovoltaic (solar) panels, glass windows, and the like, used outdoors or inside buildings. Embodiments of the innovative coating apparatus comprise manually controlled and autonomous portable coating assemblies, wherein the entire assembly, or a portion thereof, is adapted to travel, translate, or otherwise be conveyed along a substrate surface while spreading an even and uniform layer of a liquid coating solution, which then cures to form a solid coating layer. The coating may be an optical coating, as, for example, an anti-reflective coating, advantageous for increasing efficiencies of photovoltaic panels and solar thermal panels, or reducing glare from glass window panes.

It is a primary object of the innovation described herein to provide a facile means of applying coatings of field installations of substrates post-manufacture, as, for example, an array of photovoltaic panels installed outdoors at a power generation facility, an array of solar thermal panels installed on a building roof or in another outdoor location, and the like. As coatings such as anti-reflective coatings are proven to increase efficiencies of photovoltaic panels in particular and have begun to gain wide acceptance in recent years, it may be advantageous to retrofit older panels already deployed in installations with such coatings; however, present coating systems are stationary apparatuses for use in a manufacturing facility, for example, and the current post-manufacture coating protocol requires the dismantling of a photovoltaic (or other) array and sending the panels to a facility to have the coating done. This is obviously expensive and disruptive, where the costs of going this route may outweigh the efficiencies gained by the coating, at least in the short term. The instant innovation provides a desirable solution to this dilemma, whereby a portable coating system is provided having the ability to traverse the surface of a panel substrate and deposit a high-quality coating across the entire surface of the substrate. By high quality, it is understood that the films deposited by the instant innovation are substantially uniform in thickness across the substrate.

To achieve such uniformity in coating thickness, the instant innovation is adapted to be placed on or over a panel substrate, and then to cause the coating mechanism to traverse the panel while spreading the coating solution at a substantially constant deposited volume per panel substrate unit area. For some coating applications, some embodiments of the instant innovation may comprise a portable coating assembly adapted for coating installed panel substrates of the type described above, wherein the portable coating assembly comprises a support structure having dimensions that are compatible with panel dimensions (e.g., the width of the support structure is compatible with the width of the panel). Some portable coating assembly embodiments may further comprise one or more coating applicator mechanisms or structures and a conveyance mechanism that is adapted to move the one or more coating applicator mechanisms along their trajectory on the surface of the panel substrate.

The inventive portable coating assembly further comprises one or more innovative coating applicator mechanisms affixed to the support structure. In some embodiments, the support structure may take the form of a platform. The coating applicator mechanisms comprise a means to deposit the coating solution on the surface of the substrate, said means including, but not limited to spray heads, rollers, slots, brushes, doctor blades, wipers, draw-bars, sponges, foam, porous textile layer or a combination of such.

In some embodiments, the coating applicator mechanisms comprise one or more applicator heads, each of which further comprises a deformable core body, composed of a compliant and deformable material, and a microporous "skin", or interface layer having a certain micropore volume sufficient to hold a determined amount of liquid coating solution and contacting a portion of the surface of the deformable core body. The deformable core body may also be porous in nature and serve the function of an additional reservoir for a liquid coating solution, and the microporous layer serves the function of an interface between the deformable core body and the substrate surface, whereby the micropores act as a capillary array to transfer coating solution to the substrate. In some embodiments, a textile such as a felt fabric may be used as the microporous interface layer. Felt fabrics have a large plurality of fibers oriented randomly within the fabric, where the interstitial spaces between the fibers present an extensive array of tortuous micropores.

Moreover, felts can be fabricated from a large variety of fibers to virtually any thickness, and have very fine and soft textures ideal for uniform spreading of liquids on surfaces. The soft and compliant nature of felts make them ideal for use as a microporous interface layer. In addition to felts, other fabrics and materials may be used for the same purpose (e.g. woven sheet and high porosity foam). The micropores of the felt interface or an interface created by other materials effectively act as an array of capillaries that store and transfer liquid coating solution to the surface in a manner that is substantially uniform over the contact surface of the applicator head or other suitable coating mechanism. As coating solution is depleted in the microporous interface layer, in one embodiment where the deformable core is also porous and contains coating solution, the microporous interface layer may draw coating solution from the deformable core and transfer it to the substrate surface. In another embodiment, coating solution may be pumped from a reservoir through one or more tubes to the microporous interface layer before or during the coating process.

The instant innovation includes manually guided and automated embodiments, and combinations thereof. Manually guided embodiments of the instant innovation comprise the support structure and coating mechanism assembly discussed above, further comprising a handle extension of the support structure that may be rigid or bendable, where the latter may comprise springs in the handle to compensate for variations in hand-applied pressure, which can lead to non-uniformities in coating thickness. Handles may also be pivotally attached to the inventive portable coating assembly, providing ergonomic deployment of the invention. Automated embodiments may comprise mechanized or robotic coating assembly versions, whereby the support structure and coating mechanism assembly may further comprise a conveyance mechanism comprising a motorized drive.

An example of this type of embodiment is an electric motor affixed to the support structure, and coupled to a roller axel via a chain, belt or a gear train, whereby the roller axle may be connected to wheels or other devices to convey the coating assembly across the substrate. The electric motor may be controlled by an electronic motor control circuit in some embodiments. In other embodiments, the electronic motor control circuit programmable, and in yet further embodiments may also be capable of wireless control and programming. As an example, the motor serves the function of driving the innovative portable coating assembly at a constant speed to enable deposition of coatings having substantially uniform thicknesses in one embodiment. As a further example, if a thickness gradient is desired across the substrate, the motor can be programmed to ramp the speed of the assembly in another embodiment. In a still further embodiment, a ramped or variable speed may also be desired for maintaining a substantially uniform coating thickness in possible embodiments where the coating solution flow rate is also ramped or variable.

In automated embodiments, the electronic motor control circuit may also receive input from sensors that measure parameters that may correlate with the motor speed necessary to maintain a substantially uniform thickness. Such measured parameters may include ambient temperature, ambient humidity, or amount of light reflection from the coated surface. The electronic motor control circuit may then use these measured parameters to adjust the motor speed. In this way, a substantially uniform coating thickness may be maintained even if the measured parameters may change over time.

In some embodiments, the effective width of the support structure is sufficient to span the width of a panel substrate, requiring only a single excursion of the innovative portable coating assembly in one direction along the length of the substrate to deposit the coating, simplifying the coating process. In other embodiments, a motorized drive mechanism may translate the coating applicator mechanism both lengthwise and widthwise across the substrate in a grid fashion or other motion, for example, when coating areas are wider than the width of the support structure. In other embodiments, the effective width of the support structure is adjustable to span the width of substrates of non-standardized widths. Related to this aspect, manual, partially automated or fully automated embodiments may include an elongated handle for manual placement and removal of the innovative portable coating assembly on a substrate. The elongated handle provides extended reach, and as such may have ergonomic value.

Moreover, the handle may be pivotally affixed to the support structure, providing further ergonomic value. In other embodiments, the support structure may be positioned on to or translated across the substrate by a robotic arm. In yet other embodiments, the support structure may be autonomously translated across the substrate by an on-board motor without the use of a handle or robotic arm to guide it. In yet other embodiments, a combination between manually guided and automated functions may include a handle whereby the operator may help control any motion in an axis orthogonal to the direction of coating while the automated motorized functions may guide the portable coating assembly in the direction of coating. In yet further embodiments, a cabled translation mechanism may be employed.

It is a further objective of the innovation to provide coatings of uniform thickness. For embodiments comprising one or more coating heads, each of which further comprises a deformable core body, the degree of deformation may be a function of the weight of the entire assembly supported by the coating heads when engaged with the surface to be coated, as well as other vertical forces imposed on the innovative assembly. The weight of the portable coating assembly may also be supported in part by the conveyance mechanism. The deformation may furthermore pressurize any liquid contained within the microporous interface layer, and if a porous deformable core body is used, any liquid contained within the porous deformable core body as well, increasing the flux of the liquid when discharged to the substrate surface during the coating process.

While the weight of the portable coating assembly may remain substantially constant during the coating process, fluctuations in vertical forces, for instance, those due to changes in hand or arm pressure fluctuations that may occur when the portable coating assembly is manually guided during the excursion in manual embodiments, may cause fluctuations in deposition rate of the coating. Therefore, random variations in coating thickness result, if measures are not taken to mitigate these fluctuations. In some embodiments, coating mechanisms may be attached to the support structure by force-absorbing strut members responsive to changes in vertical force, mitigating them to various extents. In one type of embodiment, the struts are in the form of leaf springs. In other embodiments, struts comprise spring-loaded articulating joints interposed between elongated members, rigid or non-rigid. In yet further embodiments, struts may be in the form of a shock-absorbing dashpot mechanism, or simple compression springs.

The spring constants, or stiffness, of the various types of strut spring components may be chosen to cause the spring to deform sufficiently in response to the magnitude of changes in applied force. The struts then may absorb or at least partially absorb force fluctuations or redistribute and mitigate these force fluctuations over time before these are transferred to the deformable porous core bodies of the coating mechanisms, causing fluctuations in the geometry and therefore the pressure on the liquid contained within. As mentioned above, these changes translate to variations in the flux of coating solution being discharged from the porous core or the microporous interface layer, ultimately resulting in variations in coating film thickness.

In the embodiments described in the preceding paragraph, the force-absorbing struts connect the coating heads to the support structure. In alternative embodiments, struts may connect the conveyance device to the support structure, whereas the coating mechanisms may be either suspended by more rigid members, or again connected by force-absorbing members. In other embodiments, the coating mechanisms may be connected to the support structure by means of hinged brackets or slides which minimize the transfer of vertical forces from the support structure to the coating heads during the coating process. In some embodiments, coating solution may be charged to the one or more coating heads in a continuous or discontinuous manner, for instance by an on-board pumping system, and in other embodiments, the coating heads are charged continuously or discontinuously by an offline means. Reducing complexity, weight and expense of the innovative portable coating assembly, offline transfer of coating solution to the coating head or heads is a preferable solution, whereby the pumping system and coating solution reservoir is eliminated from the assembly. To this end, a separate charging or re-filling station may be provided. In one embodiment, a charging station comprises a frame or superstructure, a dosing platform, a receiving structure to place the innovative portable coating assembly, whereby the receiving structure is adapted to position the coating heads of the innovative portable coating assembly on the dosing platform. Other methods of charging the coating heads are embodied by continuous and intermittent on-board or off-board pumping systems.

In addition to anti-reflective coatings, this invention may be used to deposit other performance enhancement coatings, including wave-length shifting coatings and filter coatings such as "Low-E" coatings that minimize the transmission of either ultraviolet light or infrared light or both. In other embodiments, the performance enhancement coating may be a multi-functional coating, providing a combination of two or more functions, including, but not limited to anti-reflection, wave-length shifting, filtering of ultraviolet or infrared or both, anti-soiling, self-cleaning or thermal energy management.

The instant innovation is a single-layer energy transmission enhancement coating having tunable optical (transmittance), hydrophobicity (moisture resistance) and hardness (abrasion resistance) characteristics. The energy transmission enhancement coatings are a class of optical coatings including, but not limited to, quarter wavelength anti-reflective (AR) coatings, where the thicknesses may be on the order of several hundred nanometers. In addition, the instant innovation provides for low-temperature coating and curing process for applying a novel liquid sol-gel precursor coating solution formulation that results in the instant single-layer coating with the enhanced properties. By single-layer, it is meant that the final coating is substantially compositionally uniform across its thickness. When describing the coating process, it may be indicated that a single pass or double pass is used to deposit the coating precursor solution. According to the instant innovation, it is to be understood that this terminology may indicate that compositionally or structurally heterogeneous layers are deposited, as is commonly done in the art. According to the innovation, a multiple pass deposition process, such as a double pass, involves coating two or more layers of the same or different precursor solution of the same or different composition, resulting in a energy transmission enhancement coating that may or may not be substantially compositionally and structurally uniform across its thickness. Thus the term "single layer" is used throughout this disclosure to describe the resulting innovative energy transmission enhancement coating as being substantially compositionally and structurally uniform across its thickness. In other instances, the coating prepared by a multiple pass process may be non-uniform across its thickness. It is an object of the instant innovation that the energy transmission enhancement coating is curable at low temperatures. For example, the inventive coating solution may be cured at 50° C. for 8 hours and provide excellent abrasion resistance. The 50° C. for 8 hours in duration may occur all in one time period or it may occur cumulatively over several time periods. This is contrasted to more conventional coating compositions that require substantially more time to cure at such low temperatures or that may not cure at all at such low temperatures, resulting in films that may have poor abrasion resistance. As a result of the excellent performance of the low temperature curing process, the invention provides for sun-curable AR coatings, allowing for, as an example, retrofitting a solar panel installation in the field with durable AR coatings whereby the coating is cured only by passive solar thermal energy. In an alternative embodiment, the inventive coating may cure due to chemical energy contained within the coating solution itself and not require solar thermal energy.

The cured coating layer may comprise hollow-spherical and/or solid silica nanoparticles or nanospheres that comprise a size distribution ranging from 2-200 nm. In all cases the cured coatings of the instant innovation comprise a cross-linked silica matrix incorporating into its structure at least one siloxane agent in the form of a hard coat or another chemical component that enhances the robustness of the coating. The afore-mentioned components are mixed as sol-gel coating precursors in the liquid state, and then deposited onto a substrate in the liquid state by various deposition means with a subsequent curing process to produce a durable coating ranging between 50 nm and 250 nm in thickness, whereby the deposition process and composition of the precursor coating solution are tunable to enable desired spectral characteristics. Accordingly, the inventive optical energy transmission enhancement coating can be prepared with a range of predictable hydrophobicity and abrasion resistance, by variation of the concentration of at least one of the coating precursors in the coating solution formulation, as well as the curing process. Preferably, the concentration of the siloxane can be varied to produce predictable changes in the hydrophobicity and durability of the inventive coating.

The instant innovation thus provides the advantage of tailoring the moisture resistance (hydrophobicity) and hardness of the coatings by tailoring the coating composition to suit durability requirements dictated by the particular application to which the substrate is subjected. The coating process may be carried out by a variety of methods, including but not limited to: spray-coating, dip coating, roller coating, doctor-blade coating, wiper coating, draw bar coating, sponge coating and brush coating. Furthermore the thickness of the film may be tailored by the judicious choice of the coating process and adjustment of coating parameters, including viscosity of the coating precursor solution. The inventive optical coating may be prepared as a single layer coating or in multiple layers. Preferably, the inventive optical coating may be prepared by applying a single pass of coating precursor solution, or by applying a double pass coating, where the first pass is the application of the coating precursor solution, curing or partially curing the first layer, and then applying a second layer of the same coating precursor solution, or a different solution, such as a hard coat or another solution that enhances the coating robustness, where the second coating solution may be compositionally distinct from the first layer.

For the purposes of this disclosure, the substrate may be a solar photovoltaic panel, a solar thermal panel, a sheet window glass, an eyeglass lens, or any other transparent or non-transparent object having at least one reflective surface where it is desired to suppress the reflectivity. In this way, the durability requirements of an energy transmission enhancement coating on, for instance, a photovoltaic or solar thermal panel may be satisfied by the selection of one set of coating precursor component ratios from a coating precursor component ratio continuum disclosed herein to yield coatings of the requisite durability. Conversely, an energy transmission enhancement coating such as an AR coating applied to substrates having less stringent durability requirements, said requirements being satisfied by the selection of another set of coating precursor component ratios from the same continuum of coating precursor component ratios disclosed herein.

It is one aspect of the instant innovation to provide an energy transmission enhancement sol-gel coating that may be applied and cured in the field, where the term "field" indicates application of the coating to substrates such as solar panels in an outdoor array installation, where the array can consist of a single panel or multiple panels. The term "substrate" most commonly indicates panels of the type referred to above, viz, photovoltaic panels and solar thermal panels, but may also include glass windows installed in structures. Therefore, instant innovation includes a field coating process, and the finished energy transmission enhancement coating product produced by the innovative process. However, the term field may not be limited to out-of-doors environments, and can include indoor installations, or those existing in an enclosed structure.

BRIEF DESCRIPTION OF THE DRAWINGS

FIG. 12b Top oblique view of coating applicator mechanism assembly, showing lever spring struts disposed for attachment to support structure.

FIG. 12c Top oblique view of coating applicator mechanism assembly, showing leaf-spring struts disposed for attachment to support structure.

FIG. 12d Top oblique view of coating applicator mechanism assembly, showing dashpot mechanism struts disposed for attachment to support structure.

FIG. 24a Operational schematic of the innovative portable sensor.

FIG. 24b Zoom view of an illuminated portion of a substrate surface (coated or uncoated), showing surface irregularities and non-uniformities FIG. 25 Mobile coating apparatus example deployed on a photovoltaic panel, where the innovative portable sensor is mounted on the chassis of the apparatus.

DETAILED DESCRIPTION

Figure 1:
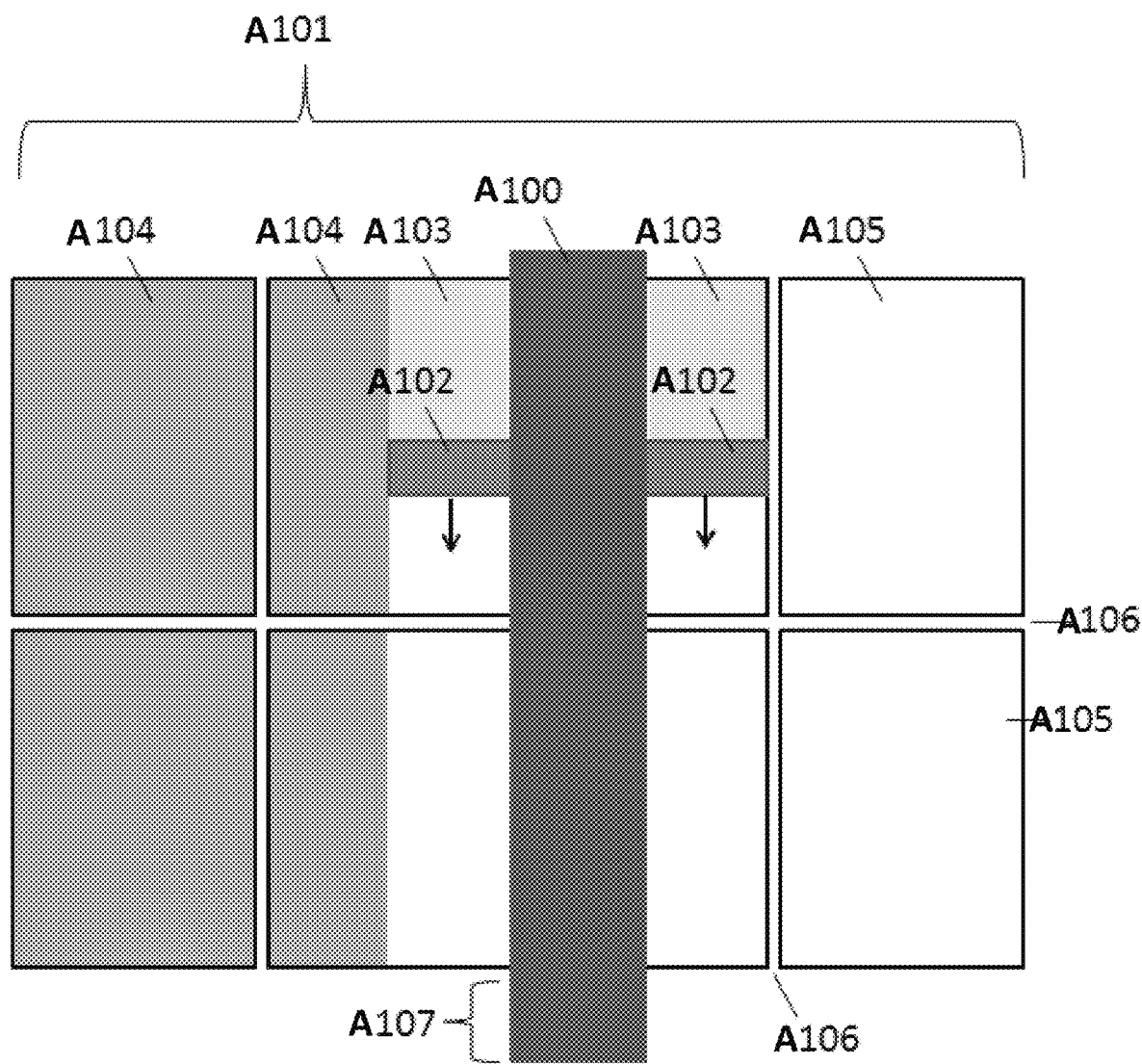
FIG. 1 Overview of the apparatus for forming a nanostructured thin film with porosity gradient on an array of sloped outdoor panel surfaces using meniscus drag.

Referring to FIG. 1, the inventive apparatus for forming a nanostructured thin film with porosity gradient on an array of sloped outdoor panel surfaces using meniscus drag comprises an applicator A100 which mounts onto an array of sloped outdoor panel surfaces A101, and that uses at least one or more meniscus drag deposition mechanisms A102 to deposit a solution A103 comprising various solvents, partially polymerized siloxanes, and amorphous silica with a wet film thickness ranging from 5 um to 100 um which then forms a nanostructured thin film A104 comprising nanostructured silica and ranging in thickness from 50 nm to 250 nm with a porosity gradient dependent at least in part on the evaporation of the various solvents onto the sloped outdoor panel surfaces A105. In at least multiple locations across the nanostructured thin film A104 (ranging across at least 20%-80% or more of the nanostructured thin film A104, the porosity gradient ranges from at most 30% porosity nearest at least one of the surfaces of the sloped panels A105 to at least 60% porosity furthest from the at least one surface of the sloped panels A105. The solvents comprising the solution comprise at least the following, each ranging in percent volume between 1% and 50%: ethanol, propylene glycol methyl ether, and methanol. The porosity gradient depends at least in part on the evaporation rates of the various solvents. The evaporation rates depend at least in part on the temperature of the sloped outdoor panel surfaces A105.

Prior to coating, the surfaces of the sloped panels A105 should be thoroughly cleaned with deionized water. The speed of application of the solution by the at least one or more meniscus drag deposition mechanisms A102 is dependent at least in part on the viscosity of the solution A103 which is dependent at least in part on the temperature of at least one of the surfaces of the sloped panels A105. The speed may be derived and/or approximated through fluid physics formulas relating the viscosities of the specific mix of solvents and other constituents comprising the solution to the temperature of the at least one of the surfaces of the sloped panels A105. Alternatively, the speed may be derived from a table of known relationships between speed and the temperature of the at least one of the surfaces of the sloped panels A105 for a given mix of solvents and other constituents comprising the solution. The applicator A100 may use a temperature sensor to determine the temperature of the at least one of the surfaces of the sloped panels A105.

Figure 5:
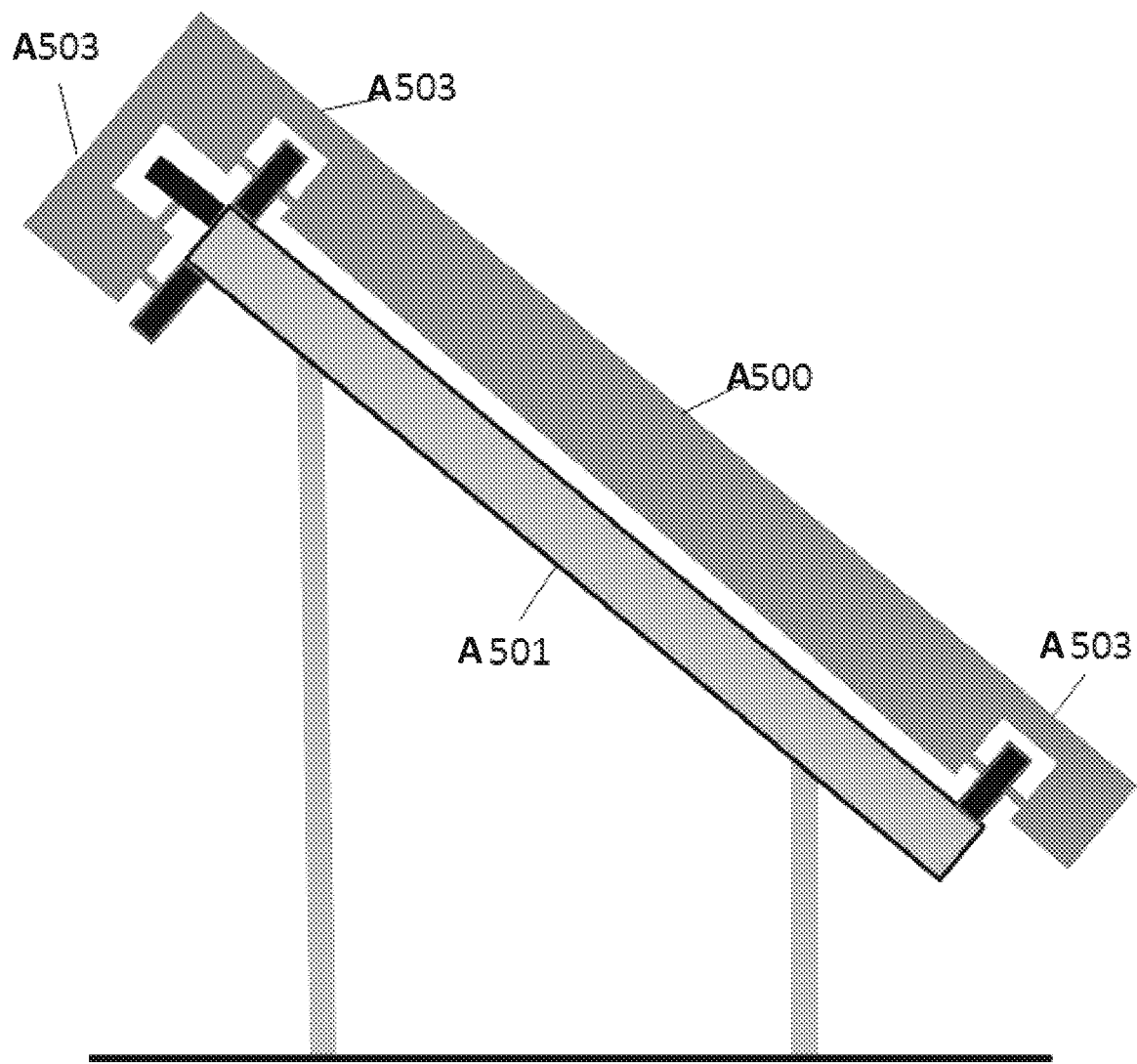

The applicator A100 may translate across the array of sloped outdoor panel surfaces A101 by use of various motivator mechanisms (see FIG. 5 for at least one exemplary embodiment). As the applicator A100 translates across the array of sloped outdoor panel surfaces A101, it may deposit the solution on the at least one of the surfaces of the sloped panels A105 continuously or discontinuously. In the latter case, the applicator A100 may stop at various positions along the array of sloped outdoor panel surfaces A101 and use either internal reference points to determine its position (e.g. encoder signals from a servo drive mechanism) or sensor feedback that detects specific features of the array of sloped outdoor panel surfaces A105 such as gaps that may exist between panel surfaces 106. Such sensor feedback may be provided by through beam sensors, reflection detecting sensors, roller level switch sensors, vision system camera sensing means, or other sensing means. Alternatively, the applicator may determine its position through a combination of both internal reference points and external sensor feedback. In some embodiments, in addition to using sensors to detect the applicator position relative to the panels, the applicator may use sensors for feedback control of the coating process. Such sensors may include temperature sensors, reflection sensors, humidity sensors, solar irradiance sensors, wind speed sensors or other sensors for measuring characteristics of the panels, the solution, the nanostructured thin film, the ambient environment, the applicator itself or parts of the applicator or meniscus drag mechanisms, or other key metrics for controlling the coating process. In some embodiments, the coating process may be controlled by an algorithm that accounts for the solution viscosity and/or evaporation rate due to the solution temperature and/or the panel temperature and/or the wind speed and/or humidity and/or solar irradiance. In other embodiments, the algorithm may incorporate the reflection of the panels before and/or after coating.

In the process of depositing the solution, the at least one or more meniscus drag deposition mechanisms A102 may need to run off at least one end of at one of the surfaces of the sloped panels A105 in order to deposit a uniform coating. To accommodate this the applicator A100 may have an extension A107 that extends beyond the end of one of the surfaces of the sloped panels A105 that enables the at least one or more meniscus drag deposition mechanisms A102 to run off at least one end of at one of the surfaces of the sloped panels A105. The applicator A100 may also need to engage and disengage the meniscus drag mechanism from at least one of the surfaces of the sloped panels A105. This can be accommodated by the addition of at least one or more lifting mechanisms that can lift or lower the at least one or more meniscus drag mechanisms A102 relative to at least one of the surfaces of the sloped panels A105. The at least one or more lifting mechanisms can comprise at least one or more electric linear motors or pneumatic cylinders. Furthermore, the at least one or more lifting mechanisms can lift or lower the at least one or more meniscus drag mechanisms A102 together or independently from one another.

The at least one or more meniscus drag mechanisms A102 may be positioned near each other within the applicator A100 or positioned on one side of the applicator A100 or positioned apart from each other. In the latter case, the at least one or more meniscus drag mechanisms A102 may be positioned on opposite sides of the applicator A100 as shown in FIG. 1. In the former case where the meniscus drag mechanism are positioned near each other, the applicator may translate across the array of sloped outdoor panel surfaces A101 a fixed distance approximately equal to the total width of the at least one or more of the meniscus drag mechanisms A102 in between one or more coating passes when coating discontinuously. In the case where meniscus drag mechanisms A102 are placed on opposite sides of the applicator A100, the applicator may use an algorithm to determine how far to translate in between coating passes when coating discontinuously, where not all the translation distances will be approximately the same between one or more coating passes. The one or more meniscus drag mechanisms A102 may operate synchronously together or asynchronously from each other.

The nanostructured thin film A104 may have at least one of the following properties: anti-reflection; anti-soiling; wavelength shifting; anti-ultraviolet; anti-infrared; low-E; electromagnetic band pass filtering; or a combination thereof. The array of sloped outdoor panel surfaces A101 may comprise a solar photovoltaic panel array. Alternatively, it may comprise an array of mirrors, glass panels, plastic panels, blackbody absorbers, or some other surfaces. The at least one or more sloped panels A105 may comprise at least one or more solar panels. Alternatively, the at least one or more sloped panels A105 may comprise at least one or more mirrors, glass panels, plastic panels, blackbody absorbers, or some other panels.

Figure 2:
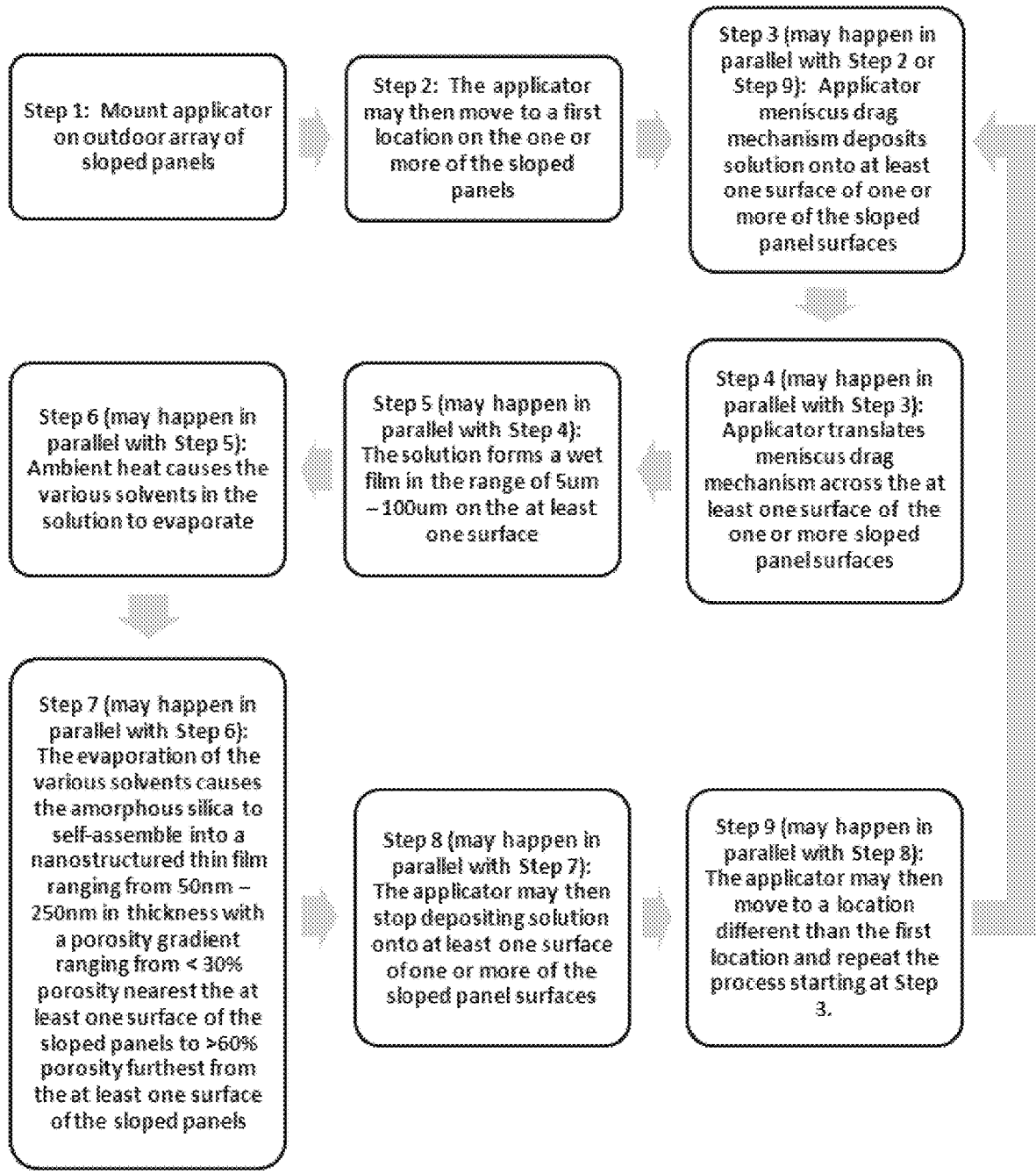
FIG. 2 Flow chart method process steps for forming a nanostructured thin film with porosity gradient on an array of sloped outdoor panel surfaces using meniscus drag FIG. 3 Cross section of wet film deposited by meniscus drag deposition FIG. 4 Cross section of nanostructured thin film with a porosity gradient FIG. 5 Example means of translating applicator across the array of sloped outdoor panel surfaces FIG. 6 Additional example means of translating applicator across the array of sloped outdoor panel surfaces FIG. 7 Example of reflection sensing device for use by the applicator for feedback control of the coating deposition process FIG. 8 An alternate embodiment of a method or use of the apparatus whereby the coating process is done horizontally.

Referring to FIG. 2, one method of using the inventive apparatus for forming a nanostructured thin film with porosity gradient on an array of sloped outdoor panel surfaces using meniscus drag consists of the following process steps:

Step 1—Mount applicator on outdoor array of sloped panels;
Step 2—The applicator may then move to a first location on the one or more of the sloped panels;
Step 3—(may happen in parallel with Step 2 or Step 9): Applicator meniscus drag mechanism deposits solution onto at least one surface of one or more of the sloped panel surfaces;
Step 4—(may happen in parallel with Step 3): Applicator translates meniscus drag mechanism across the at least one surface of the one or more sloped panel surfaces;
Step 5—(may happen in parallel with Step 4): The solution forms a wet film in the range of 5 um-100 um on the at least one surface;
Step 6—(may happen in parallel with Step 5): Ambient heat causes the various solvents in the solution to evaporate;
Step 7—(may happen in parallel with Step 6): The evaporation of the various solvents causes the amorphous silica to self-assemble into a nanostructured thin film ranging from 50 nm-250 nm in thickness with a porosity gradient ranging from <30% porosity nearest the at least one surface of the sloped panels to >60% porosity furthest from the at least one surface of the sloped panels;
Step 8—(may happen in parallel with Step 7): The applicator may then stop depositing solution onto at least one surface of one or more of the sloped panel surfaces;
Step 9—(may happen in parallel with Step 8): The applicator may then move to a location different than the first location and repeat the process starting at Step 3.

Figure 3:
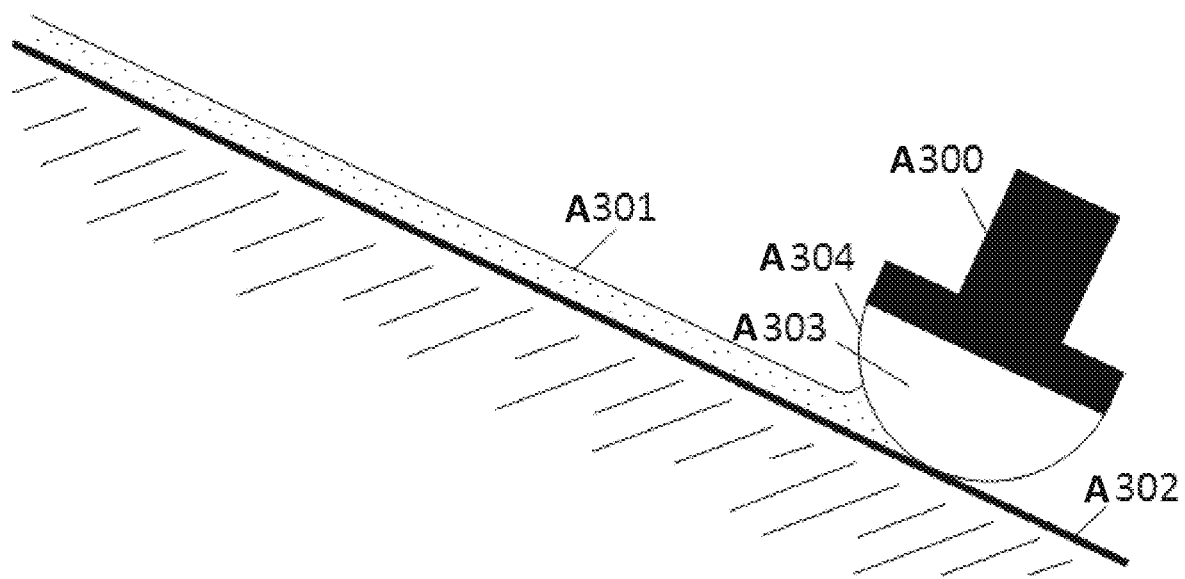

Referring to FIG. 3, the meniscus drag mechanism A300 deposits a solution A301 comprising various solvents, partially polymerized siloxanes and silica on to at least one surface A302 within the array of sloped outdoor panel surfaces. The meniscus drag mechanism A300 may comprise a porous material A303 through which solution A301 passes before being deposited onto the at least one surface A302 within the array of sloped outdoor panel surfaces. In another embodiment, the porous material A303 may be in contact with another porous material 304, in which case the solution A301 passes from porous material A303 to porous material A304 before being deposited onto the at least one surface A302. In some embodiments, porous material A304 may be have greater capillary attraction than porous material 303. In the latter case, as solution passes through material A304 and is deposited onto the surface A302, additional solution may transfer from porous material A303 to porous material A304 due at least in part to porous material A304 having greater capillary attraction than porous material A303. Both porous material A303 and porous material A304 may serve as a small reservoir of solution during the coating process. The meniscus drag mechanism may comprise one or more manifolds to which solution is pumped or gravity fed by at least one or more tubes from one or more larger solution reservoirs. The one or more manifolds may distribute solution across either the porous material A303 or the porous material A304 or both.

Figure 4:
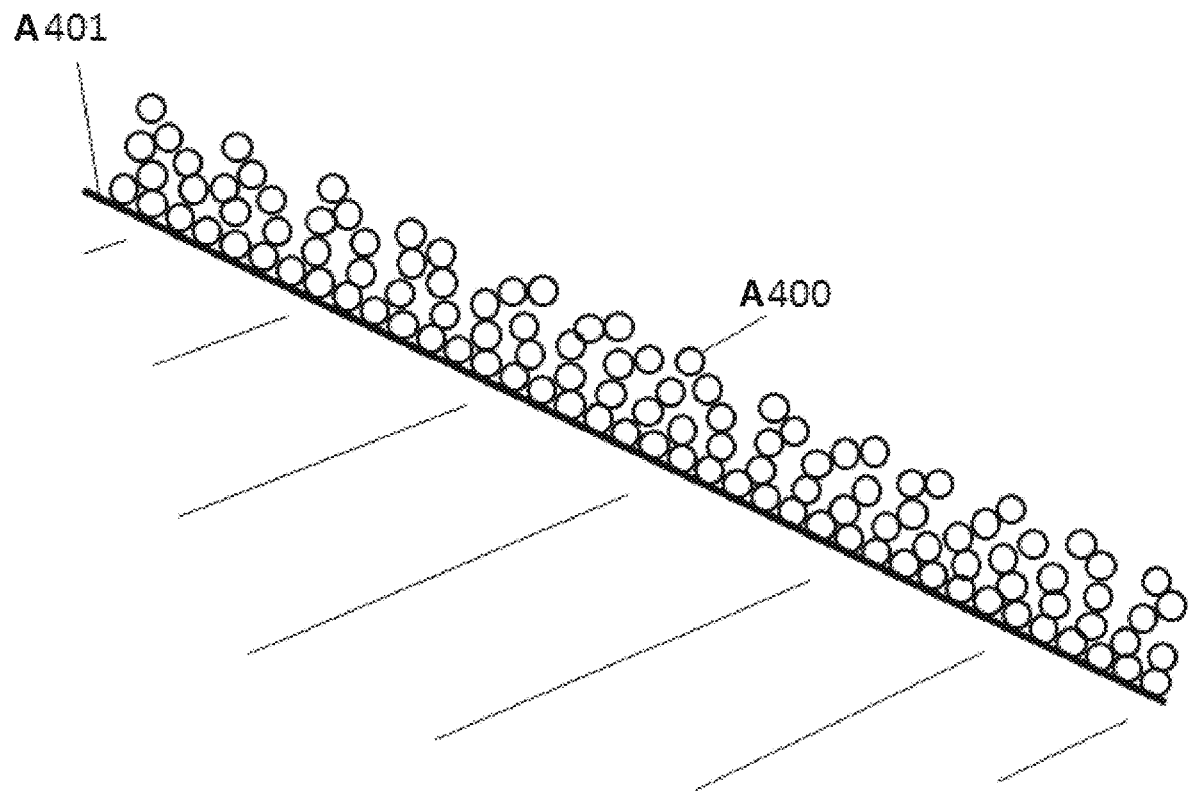

Referring to FIG. 4, the solution A301 from FIG. 3 comprising various solvents, partially polymerized siloxanes and silica forms a nanostructured thin film A400 with a porosity gradient dependent at least in part on the evaporation of the various solvents on at least one surface A401 within the array of sloped outdoor panel surfaces.

Referring to FIG. 5, in at least one embodiment, the applicator A500 comprises various motivator mechanisms A503 which may comprise motorized wheels, rollers, tractor tread, or other motivator means. As shown in FIG. 5, in at least one exemplary embodiment, at least one motivator mechanism A503 (e.g. motorized wheel assembly) is in contact with at least one top edge of at least one panel A501 within the array of sloped outdoor panels. This at least one motivator mechanism helps keep the applicator A500 aligned with the at least one panel A501 and prevents it from sliding off the panel due to gravity. Also as shown in FIG. 5, in at least one exemplary embodiment, at least one motivator mechanism A503 (e.g. motorized wheel assembly) is in contact with at least one top back edge of at least one panel A501 within the array of sloped outdoor panels. This at least one motivator means helps keep the applicator A500 engaged with the at least one panel A501 during applicator operation.

Figure 6:
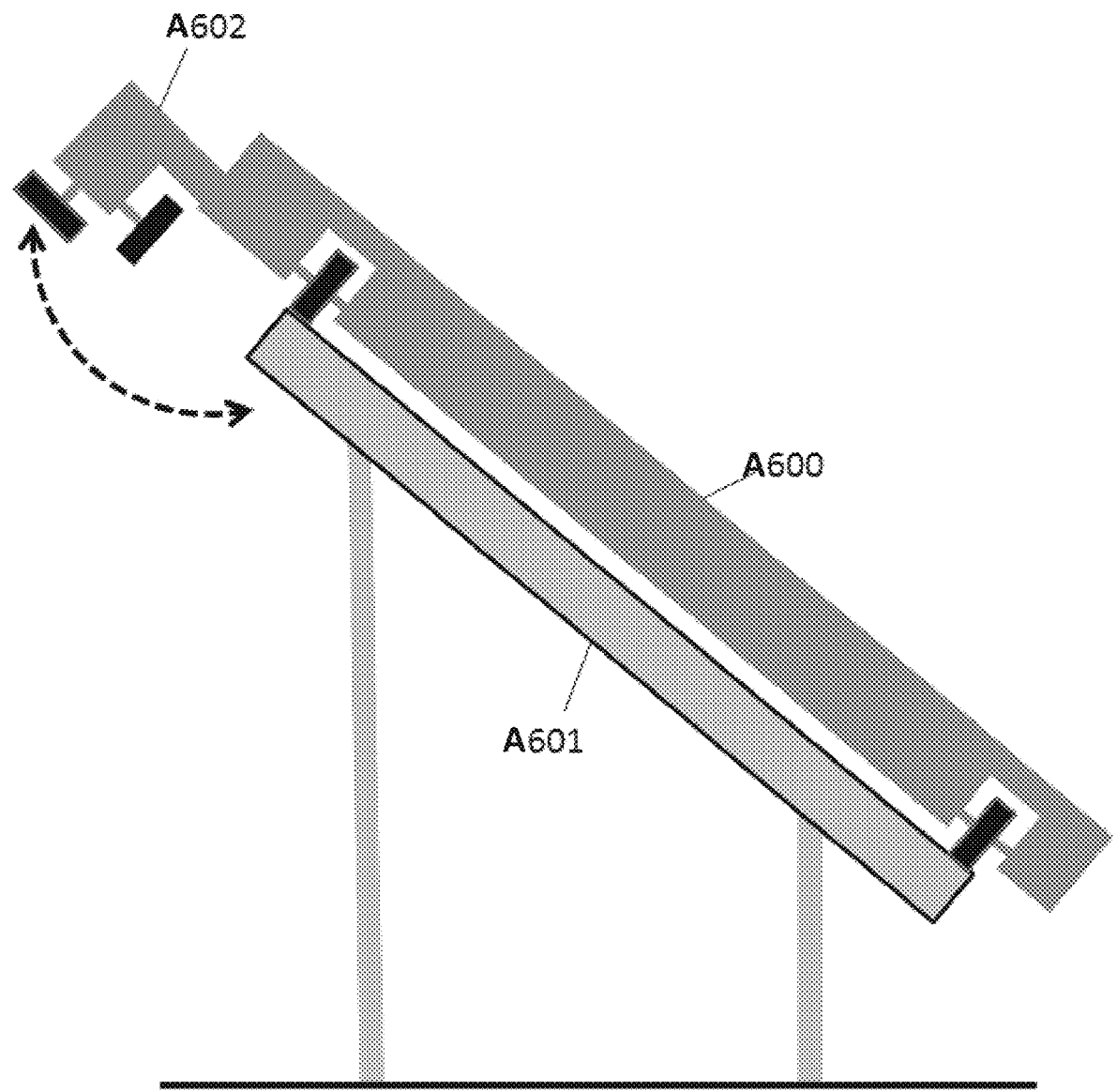

Referring to FIG. 6, in at least one embodiment, the applicator A600, mounted on at least one panel A601 within the array of sloped panels outdoors, comprises at least one motivator mechanism A602 that can move in such a way that in at least a first position, it engages with the at least one panel A601 and in at least a second position, it does not engage with the at least one panel A601. In at least a first instance, by moving the motivator mechanism A602 to the second position, the applicator may be mounted on to or removed from the at least one panel A601 in the array of sloped panels outdoors. In at least a second instance, by moving the motivator mechanism A602 to the second position, the applicator may translate across the array of sloped panels outdoors in a way that avoids collisions with support structures or other objects that may interfere with the translation of the applicator. In another embodiment, multiple motivator mechanisms A602 may be used wherein sometimes all motivator mechanisms A602 are engaged with at least one or more panels A601, at other times, only some of the motivator mechanisms A602 are engaged with at least once or more panels 601, and at yet other times, none of the motivator mechanisms A602 are engaged with at least one or more panels A601. In this embodiment or another embodiment, sequencing of the movement of the multiple motivator mechanisms A602 to either engage with the at least one or more panels A601 or not (possibly including the top and/or front and/or back sides of the panels A601) may enable the applicator A600 to remain aligned with and/or well engaged with the one or more panels A601 during the coating process (which may generate forces or be subject to gravity that might otherwise cause the applicator A600 to become misaligned or not well engaged with the one or more panels A601 during the coating process). This sequencing of the movement of the multiple motivator mechanisms A602 may also enable the applicator A600 to move across the at least one or more panels A601 without the motivator mechanisms A602 colliding with any obstacles along the applicator's path (such as mounting brackets or other hardware for the at least one or more panels A601).

Figure 7:
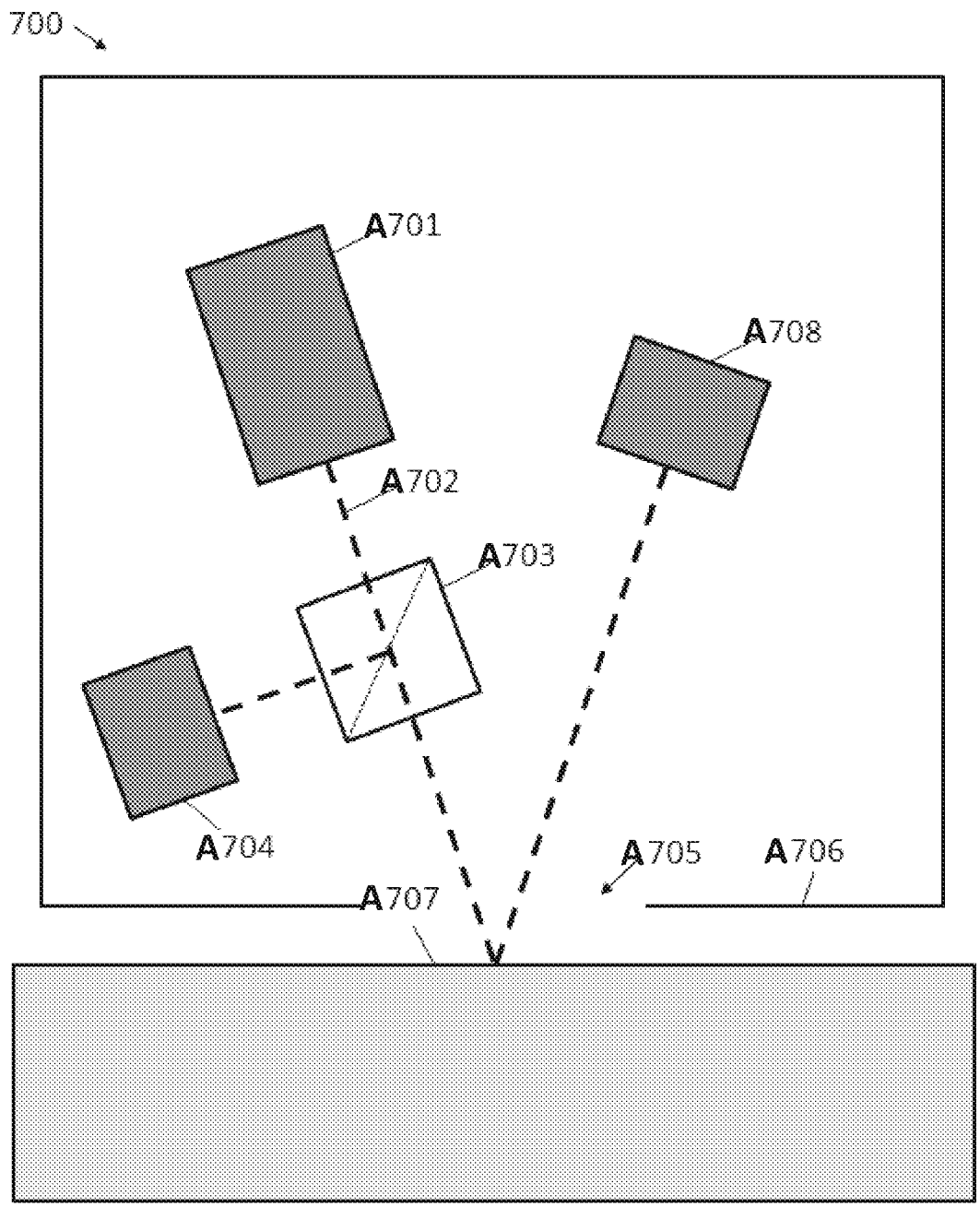

Referring to FIG. 7, in at least one embodiment, a reflection sensing device A700 is used by the applicator for feedback control of the coating deposition process. This reflection sensing device A700 may detect the reflection of one or more panels A707 before and/or after coating. The reflection sensing device A700 may detect the reflection of the panels A707 at one or more discrete points across the panels A707, or it may detect the reflection of the panels A707 along a line as the applicator or the at least one or more meniscus drag mechanisms move across the panels A707. In one embodiment, the reflection sensing device comprises one or more light sources, A701. The one or more light sources A701 may comprise one or more lasers, LEDs, or other light emitting device. The light emitted from the one or more light sources A701 may be primarily coherent light or primarily incoherent light. In the case of the light being primarily coherent light, one preferred embodiment is to use green light, with a peak wavelength around 570 nm as this is reasonably close to a key wavelength range of interest in many anti-reflective films, representing a wavelength range of high attenuation in the visible spectrum. In other embodiments, green, red, or blue primarily coherent light may be used or a combination thereof. Alternatively, white light may be used, or a combination of white light and primarily coherent light of one or more colors. The light emitted from the one or more light sources A701 may reflect off the surface of the one or more panels A707 and be received by one or more light detectors A708. The one or more light detectors A708 can then determine the intensity and/or spectral characteristics of the reflected light. In the case of the panels A707 having already been coated, the light reflected off the one or more panels A707 will include light reflected off of the coating on the one more panels A707. The light reflected off the one or more panels A707 and received by the one or more light detectors A708 may be compared before and after coating to determine the amount of anti-reflection caused by the coating and thus the coating process can be tuned to optimize the coating process and the desired amount of anti-reflection. The before and after coating reflected light comparison and the tuning process to optimize the coating process can be done manually the applicator human operator or by circuitry and/or software onboard or off-board the applicator. In some embodiments, a light shield A706 can be used to surround the one or more light emitting devices A701 and the one or more light detectors A708 to prevent or mitigate ambient light from interfering with the operation of the reflection sensing device 700. In such cases, the light A702 emitted by the one or more light emitting devices A701 can travel through one or more pass throughs A705 in the light shield A706 and reflect off the one or more panels A707 and then travel back through one or more pass throughs A705 to be received by the one or more light detectors A708. In some embodiments, the pass through A705 may comprise glass or other transparent media to allow the light A702 to pass through, but not dust or other contaminants that could soil the components of the reflection sensing device A700. In yet other embodiments, one or more additional light detectors A704 may be used to directly monitor the light A702 emitted from the one or more light sources A701 in order for the reflection measurement to compensate for any power fluctuations in the light sources 701. In some embodiments, a beam splitter may be used to direct part of the light to the one or more light detectors A704 and part of the light to be reflected off of the one or more panels A707 and back to the light detector A708.

Figure 8:
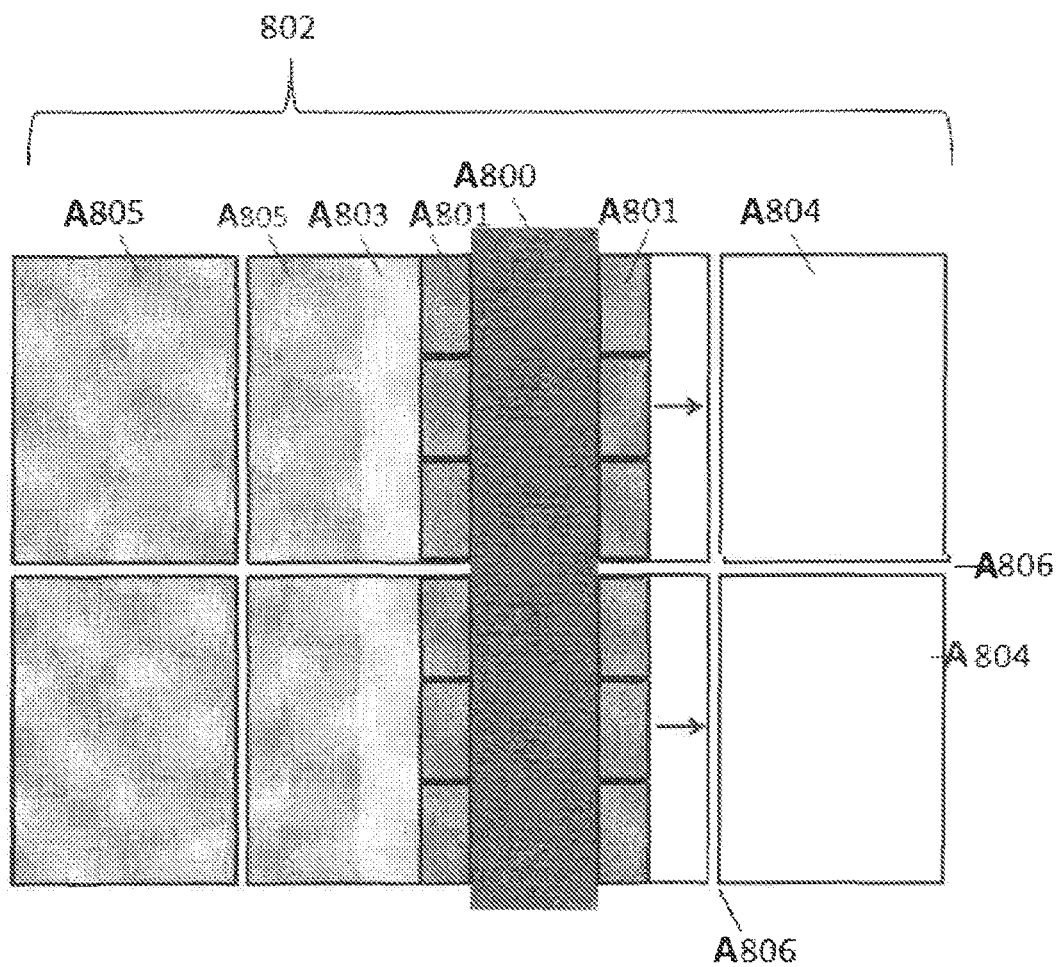

FIG. 8 shows an alternate embodiment of the method or use of the apparatus whereby the process to coat panel array A802 is done orthogonally to the embodiment shown in FIG. 1. Whereas the method or use of the apparatus embodiment shown in FIG. 1 shows the meniscus drag mechanisms depositing the coating from the top of the panels to the bottom of the panels, the embodiment shown in FIG. 8 shows the meniscus drag mechanisms A801 depositing the coating from left to right. In both embodiments, the coating can also be deposited in the opposite direction as well, that is in FIG. 1 it may be deposited from bottom to top, and in FIG. 8, it may be deposited from right to left. In FIG. 2, the applicator A800 moves across the one or more panels A804 and deposits the coating solution A803 using the meniscus drag applicators A801. The solution then forms the nanostructured thin film A805 on the one or more panels 804. The applicator may coat the panels continuously from left to right or right to left, or it may coat non-continuously, moving between panel index marks A806 or other reference point.

Figure 9:
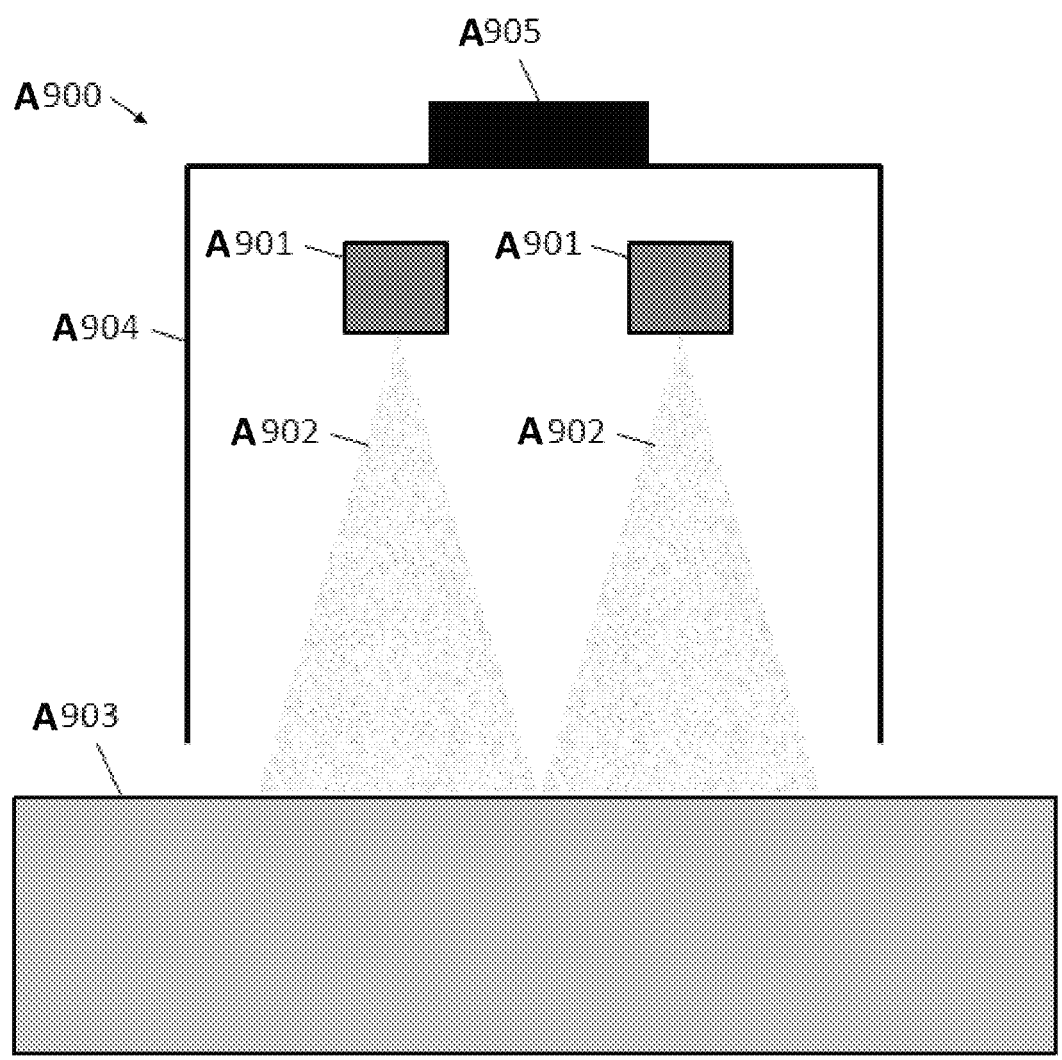
FIG. 9 An alternate embodiment of an aspect of the apparatus whereby the meniscus drag deposition method is enhanced or replaced by a spray method using a wind shield.

FIG. 9 show an alternate embodiment of depositing the coating solution onto the one or more panels A903 using a spray system A900. The spray system A900 may be placed ahead of the meniscus drag mechanisms such that the solution is deposited on the one or more panels A903 by the spray system A900 and then the meniscus drag mechanisms such as those shown in FIGS. 1, 3, and 8 uniformly distribute the solution across the one or more panels. Alternatively, the meniscus drag system may be replaced entirely by the spray system A900 to deposit the solution onto the one or more panels A903. The spray system A900 may comprise a wind shield A904 to prevent wind from interfering with the uniform spray A902 distribution onto the one or more panels A903. In some embodiments, the spray system may have one or more air movers A905 to aid in the coating deposition and/or to minimize excess spray residue or fumes (toxic, explosive or otherwise). The one or more air movers A905 may also comprise air filters to capture or filter out excess spray or fumes.

The instant innovation relates to application of liquid performance enhancing coating precursor solution to large substrates such as photovoltaic panels. The instant innovation is a portable light reflectance sensor for non-destructively determining characteristics of thin film performance enhancing coatings applied to a substrate, such as, but not limited to, a photovoltaic panel. It is particularly advantageous for outdoor installations, where photovoltaic panels installed in arrays or individually may be retrofitted with performance enhancement coatings, such as, but not limited to, anti-reflection coatings. The innovative portable light reflectance sensor provides a light source and a photodetector for measuring light incident on a substrate surface from the light source, and reflected to the photodetector. The spot size of the illuminated region of the substrate is at least 1 centimeter square in area, thus averaging over a relatively wide portion of the substrate surface vs. the much smaller spot size of a fiber optic measuring device. A single measurement may then be representative of the coating. The innovative light reflectance sensor is adapted to measure substrates in the field, and is especially adapted for assessing coating quality during the coating process. The innovative portable sensor also comprises a signal processing circuit that performs analysis of the measurements and feeds back status of the coating to the operator for coating process control.

The coating of such panels may be facilitated by a mobile coating apparatus, such as detailed in co-pending U.S. patent application Ser. No. 14/668,956, incorporated herein in its entirety. The innovative detector comprises a light source adapted to illuminate a region of a substrate with a spot cross-sectional area of at least 1 cm2, at the substrate surface, and a photodetector adapted to collect at least a portion of the light reflected from the substrate surface. In one embodiment, the innovative photodetector further comprises signal processing circuitry adapted to digitize the raw analog data collected by the photodetector. The photodetector may comprise a spectrometer that resolves the intensity of reflected light as a function of wavelength. In other embodiments, the photodetector comprises a photodiode or phototransistor. Both types may integrate the total light intensity over the entire capture spectrum of the reflected light. A variation includes the use of a bandpass filter or cutoff filters to examine a portion of the visible or invisible spectrum, the latter referring to the infrared (IR) and the ultraviolet (UV) extensions of the visible spectrum. In other embodiments, sources having a more narrow range of wavelengths, such as lasers, light emitting diodes (LEDs), cold cathode and heated cathode gas discharge lamps, such as mercury lamps and inert gas plasmas, may be employed as light sources.

The relatively large spot size of the incident beam provides the advantage of spatially integrating surface features over the area covered by the illuminated region covered by the spot. In this way, the innovative reflectance sensor is further adapted to spatially and temporally integrate the spectral characteristics of the light reflected and collected from the illuminated region of the substrate, where the photodetector is in electronic communication with the signal processing circuit. The signal processing circuit may be adapted to perform read operations to capture the signals from the photodetector on receiving a command signal, and may be further adapted to extract and store digitized photometric data from the captured sensor signal. In addition, the signal processing circuit may be adapted to perform computations on the photometric data, and then correlate the data to the one or more of the characteristics of the thin film coating on the substrate of interest. It is an aspect of one embodiment of the instant innovation that the correlated characteristics of the coating be transformed into control information to be fed back to either a human operator or to a controlling device for assessing the quality of the coating as it is applied from a liquid coating precursor solution, and if necessary adjusting the coating deposition method, or coating make-up characteristics. In this way, the deposition process may be steered to produce a finished coating having optimal performance.

A coating apparatus adapted to apply a film of liquid precursor solution that cures into a finished performance enhancement coating, such as, but not limited to, an anti-reflection coating, may be used in conjunction with the innovative portable reflectance sensor to provide a feedback component in the control loop of the coating process. The coating apparatus may be controlled manually by a human operator, or automatically or semi-automatically by an automated control system. In the automatic or semi-automatic cases, the innovative portable sensor may be used as a feedback component in a closed control loop.

It is an aspect of the innovation that the light source produce a light beam having a spot cross-sectional area of at least 1 cm2 at the substrate surface. Commercially available light sensors based on total reflection and/or spectral reflection measurements used for measuring thin film or substrate surface characteristics use small spot sizes (typically 1-2 mm in diameter). Many of these devices are designed for use in measuring surface characteristics of small substrates, such as silicon wafers. For both large and small substrates, multiple readings taken at several locations on the substrate are generally necessary to obtain a representative sample of coating or surface characteristics. The larger spot size of the instant invention allows integration of superficial properties over an area 50-100 times or larger than that provided by conventional fiber optic devices, providing a representative sampling of the local region of the surface from which the light is reflected.

It is another aspect of the invention to provide a means to correlate photometric data obtained from the light reflected off of a substrate surface and collected by the photodetector. For example, the surface may have a previously-cured performance enhancement coating, such as an anti-reflection coating, or a freshly applied liquid coating precursor solution. Optionally, the surface may be uncoated, where a measurement may be made to obtain baseline data of initial reflectance for a before-and-after comparison when a coating is applied. The raw photometric data collected may provide a measure of the reflectance of the substrate surface, as, for example, to measure the attenuation of percent reflection after application of an antireflection coating.

Another measurement derived from the raw photometric data may be the thickness and quality of coverage of a fresh layer of coating precursor solution. The photometric data may be in the form of spectral intensity data. In this case, the photodetector may incorporate a spectrometer that can scan over a range of wavelengths. In other embodiments, the photodetector may be a simple photodiode or phototransistor that is adapted to measure across a broad spectrum of light, and may be used to measure intensity integrated over the entire visible, near IR and UV spectrum to which is it sensitive, or a portion thereof, if, as an example, a bandpass filter is used. It is another aspect of the instant innovation that this information may be used for feedback control in a coating process control loop for the coating apparatus. The coating apparatus may be controlled by a human operator in one set of embodiments, thus the control loop is an open loop, or may be machine-controlled in another set of embodiments, necessitating a closed feedback control loop.

The signals may be used to indicate the thickness of a coating. As an example, a relatively high average reflectance intensity reading and a shift in the reflected spectrum toward the red or infrared side of the light spectrum may indicate that a performance enhancement coating is too thick as applied. The operator or automatic control system may need to adjust the speed of the applicator, or decrease coating precursor solution viscosity. As the spot size is large, variations normally encountered in both coating non-uniformities and variations in the underlying substrate surface, such as photovoltaic panel cover glass or photovoltaic cell surface, are integrated over the spot area and collected by the photodetector. Thus, the photodetector receives a reflection spectrum that is averaged over the relatively large spot size. The spectral intensity data may be averaged over a range of wavelengths to determine a predominant component or spectral region. By subtracting the reading from one area measured prior to coating from the reading of the same area after coating, variations other than those of the coating itself may be canceled out.

Multiple readings may be made, for example, over very large areas where several locations on the substrate surface or multiple substrate surfaces may be sampled. In this way, the uniformity of surface characteristics may be assessed. As an example, for an anti-reflection coating, the uniformity of the coating thickness and quality may be quantified. This is particularly advantageous for applying new coatings to a substrate such as a photovoltaic panel or to multiple substrates such as a solar panel array. An operator of a coating apparatus may use the innovative portable reflectance sensor to monitor the quality of the coating process by measuring the spectral characteristics of the reflected light. As an example of a method of use, an operator of the coating apparatus may first take baseline measurements on an uncoated photovoltaic panel, then apply a thin film of liquid precursor solution that will cure to form a finished coating, such as an antireflection coating.

The innovative portable reflectance sensor may include signal processing circuitry comprising an on-board microprocessor and memory, on which may be stored one or more algorithms and/or look-up tables for correlation of measurements to known film characteristics. As an example, the portable sensor may include a spectrometer that is programmed to scan a range of wavelengths and record spectral intensities. The data may be digitized and stored as binary data in the on-board memory, where the microprocessor may compare the intensity data reflected from the freshly applied liquid coating to the baseline data taken from the bare (uncoated) surface of the photovoltaic panel. In another embodiment, the data may also be offloaded to an off-board data storage and retrieval system, accessed by the portable sensor using wired or wireless means.

As an example of process control by use of the innovative portable sensor, the comparison algorithm may reveal that the reflection spectral intensities are higher than expected for an antireflection coating, and moreover that the spectrum measured is shifted toward the red or infrared side of the spectrum in comparison to an expected reflection spectrum (for example in comparison with a ¼ wave-thick index matching film). These spectral characteristics may indicate that the coating is too thick.

A further aspect of the innovation may be the inclusion of an algorithm to present recommendations to the operator as to steps required to adjust the coating process to optimize the coating. Here, the coating thickness may be a function of applicator speed and viscosity of the liquid coating precursor solution. The coating process may be adjusted, for example, by changing applicator speed, or by changing solution viscosity. In addition, the coating thickness may be corrected, if found to be out of specification by measurements taken with the innovative portable sensor, by applying a make-up coating.

In further embodiments of the innovation, measurements of air temperature and surface temperatures of the substrate may be incorporated into the portable sensor system design and algorithms. Thermal measurements may be used for further optimization of the coating process, as evaporation rates and curing rates may be taken into consideration by the optimization algorithm, preferably stored in on-board memory and executed by an on-board microprocessor, thereby adjusting the recommendations to the operator as to the optimal coating speed and solution viscosity, for example. In further embodiments, humidity sensors may also be a part of the sensor array to further refine the coating process, if, as an example, relative humidity affects the evaporation rate of the solvent used in the precursor solution, or if humidity affects (or is necessary to initiate) the curing chemistry of the coating.

In other embodiments of the instant innovation, an automated control system may replace the operator of the coating apparatus as being the recipient of the feedback from the innovative portable sensor signal processing circuitry. The automated control system may be adapted to directly respond to the feedback issuing from the innovative portable sensor signal processing circuitry. In one example, the innovative portable sensor may be mounted on a coating apparatus, and configured to continuously or intermittently measure the surface characteristics by refection spectrometry. In this example, the portable sensor is aimed at the substrate surface behind the apparatus, so that the freshly coated surface may be measured. The characteristics of the freshly applied coating may be assessed, and the speed of the coating apparatus may be controlled by a closed feedback loop. In other embodiments, one portable sensor may be situated in such a way as to measure the substrate reflection before coating and another portable sensor may be situated to measure the substrate reflection after coating, with the difference in reflection measurements being used to inform the coating process.

Figure 22:
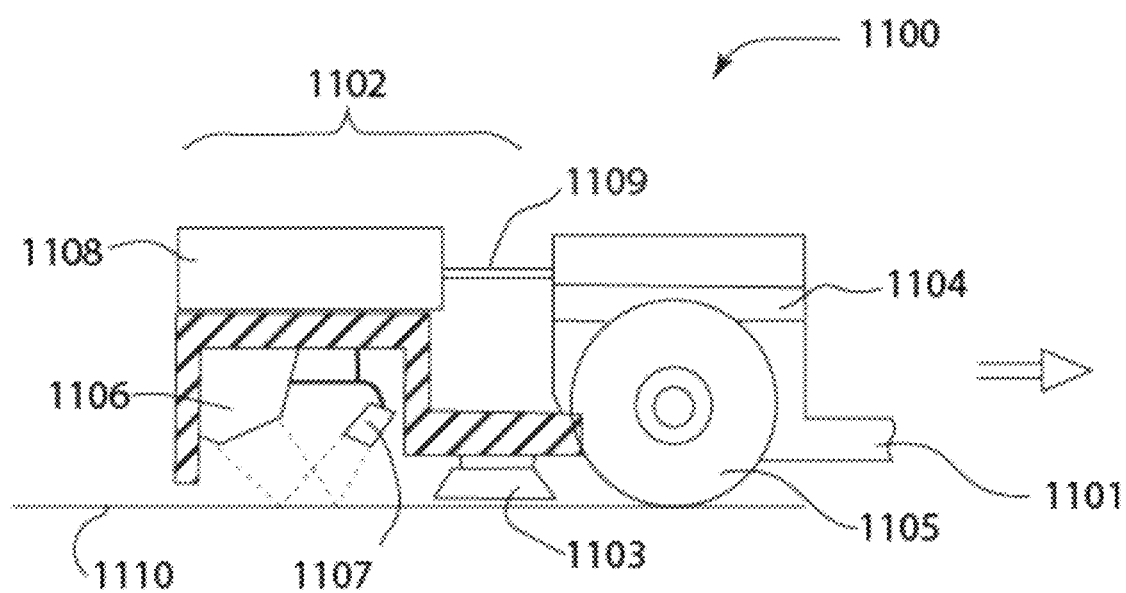
FIG. 22 Schematic representation of the componentry of the innovative portable sensor, showing an embodiment comprising a photodetector.

In FIG. 22, mobile coating apparatus 1100 is shown in a side view. Mounted on the rear side of chassis 1101 of the mobile coating apparatus is reflectance sensor 1102. Also shown affixed to chassis 1101 is coating head 1103 and motor 1104 that is coupled to wheel 1105. Reflectance sensor 1102 is shown as a side sectional view, revealing internal components. These components comprise light source 1106 and photodetector 1107, where source 1106 shines a wide beam of light making a spot size with a cross-sectional area of at least 1 cm2, on the surface of substrate 1110. Light is reflected from substrate 1110 to photodetector 1107.

As specified above, photodetector 1107 may be a spectrometer adapted to scan over a range of wavelengths, or a photodiode or phototransistor that integrates light intensities over a large range of wavelengths. As described above, the raw signal from photodetector 1107 is fed to signal processing board 1108, comprising a microprocessor and an on-board memory. The microprocessor may execute algorithms stored in on-board memory that digitize the analog signal to binary data, then analyze the data as photometric measurements such as spectral data, or overall reflectance data to show changes in surface reflectance before and after application of a coating solution by the coating apparatus. The analysis routines may require baseline data for comparison, thus requiring a measurement of the uncoated substrate or of a previously coated substrate. Before-and-after data may be compared, and changes in the spectral characteristics or reflectance values may be correlated to coating characteristics, such as film thickness.

For this conclusion, a look-up table may be employed by the microprocessor, or calculation formulas may be employed as part of the algorithm. As an example, a red shift in the reflectance spectrum may indicate that the film is too thick. The algorithms may then generate feedback control data that may be output as human-readable values, or as command signals to motor drive electronics, forming a closed control loop with the motor drive. Referring to FIG. 22, signal processing board 1108 is shown in electronic communication with drive electronics of motor 1104 via signal cable 1109. The command signals may command the motor to slow down, since the film thickness decreases at slower speeds of the mobile coating apparatus.

FIG. 23 details a schematic of the instant innovation as described. Portable sensor system B100 is shown in active deployment as a portable device, where it is disposed on a substrate surface, where substrate B101 is undergoing measurement. Incident light source B102 shines light, which may be substantially broadband light ('white' light) or narrow banded colored light, emanating from a variety of light sources. For instance, incandescent light sources may be used having coatings yielding different IR and visible spectra, or black body temperatures, as is commercially available with incandescent bulbs. Other sources may be used as well, such as mercury lamps, inert gas glow discharge (cold and heated cathode) sources, LED or laser sources. In addition, 'white' light sources using bandpass or cutoff filters may be employed. The choice may be dictated by the desired spectral range of the incident light. Light rays are shown incident on substrate B101, and reflected specularly to photodetector B103.

Additional embodiments of this innovation may include multiple light sources of the same or different types and multiple photodetectors of the same or different types. The different types may be used to detect more accurately particular wavelengths of interest. For example, a light source and/or photodetector tuned to more accurately identify blue wavelengths in conjunction with a light source and/or photodetectors tuned to more accurately identify green and or red wavelengths may provide accurate information about the characteristics of the coating without having to integrate over the whole spectrum. Such specially tuned light sources and/or photodetectors may operate in parallel or sequentially to each other in the measurement process.

This is shown in FIG. 23, where secondary photodetector B104 is positioned to gather peripheral light emanating from source B102. Signals from photodetectors B103 and B104 are routed to signal processing board B105 via cables B106. Board B105 is also in electronic or electrical communication with light source B102 via a cable B106. In addition, board B105 is in electronic communication with display B107. An additional output port B113 is shown on board 105, where output port may be a USB port, RS232 port or a parallel port for data exchange with an external computing device. In other embodiments, a wireless communication IC, such as a Bluetooth, cellular or Wi-Fi IC may also be included for wireless communication with an external computing device or the internet.

Figure 23A:
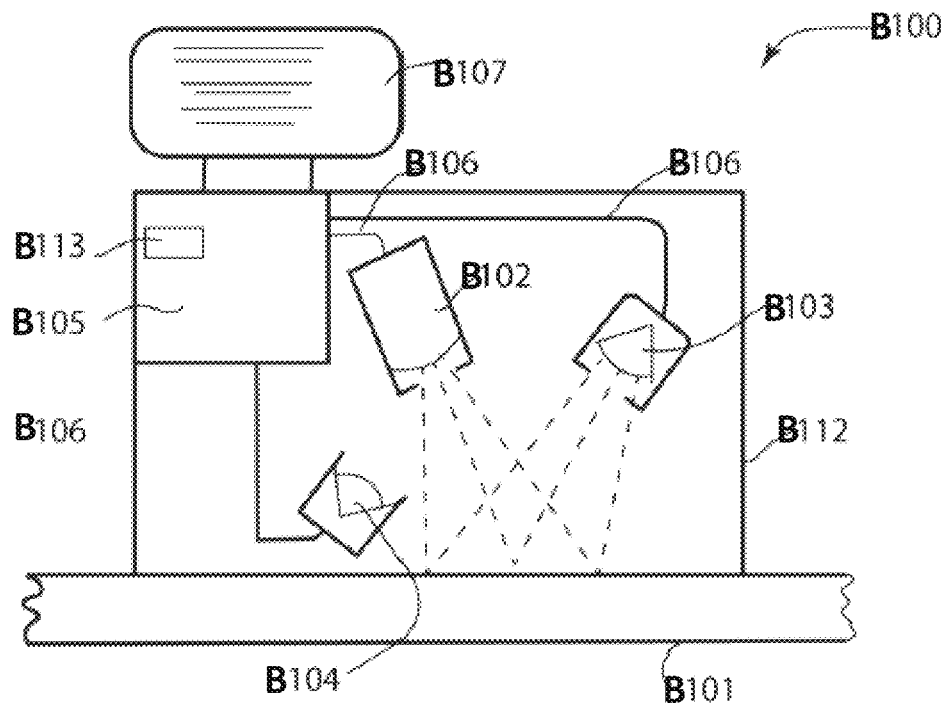
FIG. 23a Schematic representation of the componentry of the innovative portable sensor, showing an embodiment comprising a spectrometer.
Figure 23B:
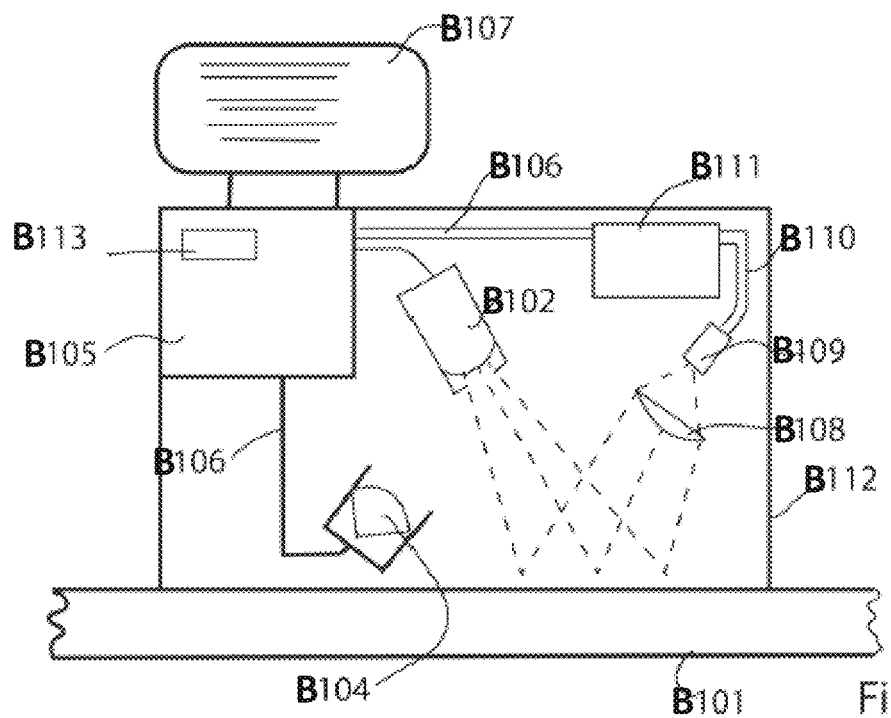
FIG. 23b Schematic representation of the componentry of the innovative portable sensor, showing an alternate embodiment comprising a spectrometer.

In other embodiment of this innovation, one or more secondary photodetectors may be used in conjunction with the primary photodetector to measure and monitor the light output from the one or more light sources themselves, and feed data back to the microprocessor in order to correct for light source fluctuations or light source drift that can change the reflection measurements This is shown in FIG. 23b, where photodetector B103 is replaced by lens B108. Lens B108 gathers reflected light and focuses it to the entrance of an optical fiber coupler B109. Light is then guided via optical fiber B110 to spectrometer or spectrophotometer B111, which is shown to be tied to board B105 via cable B106. Board B105 may comprise a microprocessor that reads spectral data from spectrometer B111 on command. Other embodiments of the instant innovation may comprise a combination of spectrometer B111 and photodetector B103. An example of a suitable miniature spectrometer to fulfill this role is an Avantes AvaSpec Micro, the STS Microspectrometer from Ocean Optics, to name a few of a number of suitable devices.

In FIG. 23a, the basic schema of the innovative portable sensor is again shown, with substrate B201 illuminated by light source B202, and reflecting light to photodetector B203, which feeds its signal to signal processing board B204. According to the innovation, the spot size cross-sectional area is at least 1 cm2 in area. In FIG. 23b, a zoom view of the region illuminated by the incident light is shown. The illuminated region has a plurality of non-uniformities in a portion of coated substrate, where a plurality of small asperities and thin areas are present, resulting in micro-variations of coating thickness. In this embodiment, photodetector B203 is not adapted to spatially resolve the light impinging upon it. Individual light rays reflected from the totality of these micro-variations may be integrated when collected at the photodetector B203 such that the intensity variations in the individual light rays are spatially averaged as to a single signal level. Photodetector B203 may comprise a spectrometer, adapted to resolve light intensity as a function of wavelength. Alternatively, photodetector may comprise a photodiode or phototransistor adapted to yield a voltage level corresponding to the averaged light intensity of the reflected light. Filters, such as bandpass or cutoff filters, may furthermore be used to block portions of the light spectrum in conjunction with a photodiode or phototransistor detectors to approximate a spectrometer.

Referring again to FIG. 23a, the signal generated by photodetector B203 is fed to signal processing circuit 204, which is in electronic communication with photodetector 203. In FIG. 24, a coating apparatus B300 of the type described in co-pending U.S. patent application Ser. No. 14/668,956, incorporated herein in its entirety, is shown moving along substrate 301. The speed and trajectory of coating apparatus B300 may be fully manually controlled by a human operator, or may be at least partially controlled automatically, with some degree of guidance or handling by a human operator. Coating apparatus B300 comprises coating heads B302 and a mounted embodiment of the instant innovation B303. An arrow shows the direction of travel by apparatus 300. The instant innovation (portable sensor) B303 is shown mounted on the chassis B304 of coating apparatus B300, where it extends over aft or rear portion.

In FIG. 25, a detailed side sectional view of the innovative portable sensor B400 based on the mounted embodiment B203 of FIG. 2. Portable sensor B300 as described in the instant disclosure is shown mounted on the rear side of chassis B401 of the mobile coating apparatus. Also shown affixed to chassis B401 is coating head B402 and motor B403 that is coupled to wheel 304. Portable sensor B400 is shown as a side sectional view, revealing internal components. These components comprise light source B405 and photodetector 406, where source B305 shines a wide beam of light making a spot size with a cross-sectional area of at least 1 cm2, on the surface of substrate B409. Light is reflected from substrate B409 to photodetector B406.

As specified above, photodetector B406 may be a spectrometer adapted to scan over a range of wavelengths, or a photodiode or phototransistor that integrates light intensities over a large range of wavelengths. As described above, the raw signal from photodetector B406 is fed to signal processing board B407, comprising a microprocessor and an on-board memory. The microprocessor may execute algorithms stored in on-board memory that digitize the analog signal to binary data, then analyze the data as photometric measurements such as spectral data, or overall reflectance data to show changes in surface reflectance before and after application of a coating solution by the coating apparatus. The analysis routines may require baseline data for comparison, thus requiring a measurement of the uncoated substrate or of a previously coated substrate. Before-and-after data may be compared, and changes in the spectral characteristics or reflectance values may be correlated to coating characteristics, such as film thickness.

For this conclusion, a look-up table may be employed by the microprocessor, or calculation formulas may be employed as part of the algorithm. As an example, a shift in the reflectance spectrum towards the red or infrared side of the light spectrum may indicate that the film is too thick. The algorithms may then generate feedback control data that may be output as human-readable values, or as command signals to motor drive electronics, forming a closed control loop with the motor drive. Referring to FIG. 25, signal processing board B407 is shown in electronic communication with drive electronics of motor B403 via signal cable B408. The command signals may command the motor to slow down, since the film thickness decreases at slower speeds of the mobile coating apparatus.

Figure 26:
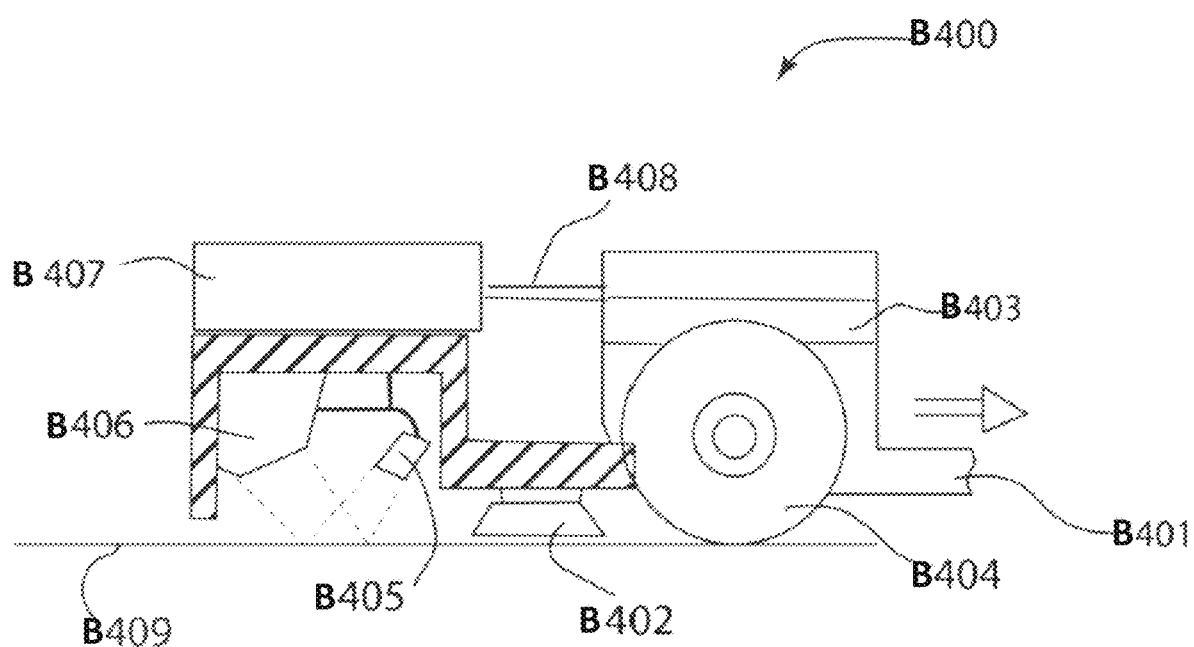
FIG. 26 A side-sectional view of an embodiment of the innovative portable sensor mounted on a coating apparatus.
Figure 27:
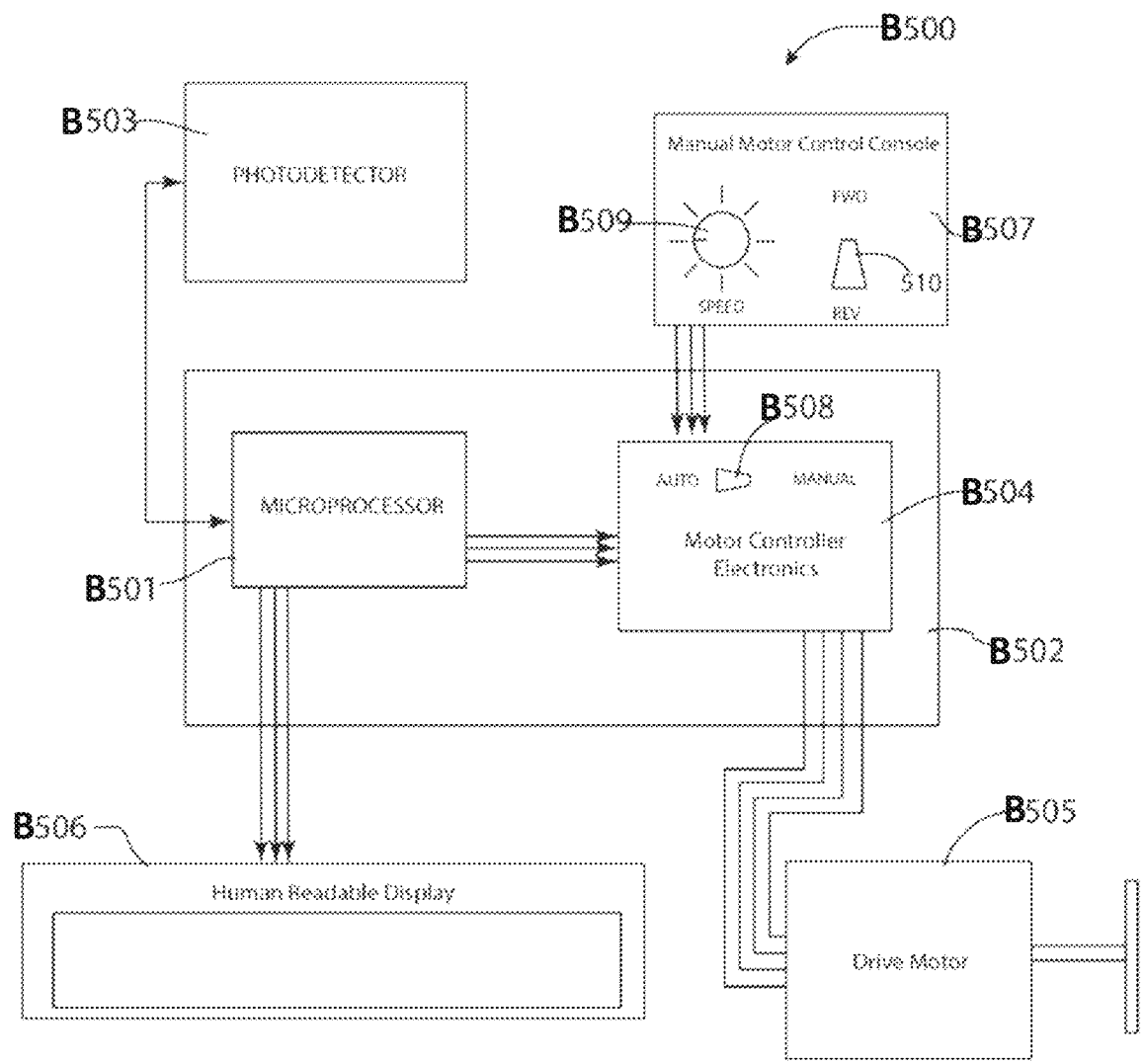
FIG. 27 Schematic diagram of an electronic control system embodiment for controlling a mobile coating apparatus.

An embodiment of the above description is shown more explicitly in the diagram of FIG. 26, showing a control system B500 for a mobile coating apparatus, for example, as described in co-pending U.S. patent application Ser. No. 14/668,956, the contents of which are incorporated herein in their entirety. The exemplary mobile coating apparatus control system B500 may be governed partially or fully by microprocessor B501, which may be physically incorporated on signal processing board B502.

Microprocessor B501 is shown to be in electronic communication with both photodetector/spectrometer B503 and motor controller electronics board 504. Analog voltage or current signals issuing from photodetector/spectrometer B503 may be digitized to binary code by an analog to digital converter (ADC) unit residing on photodetector B503 itself, or by an ADC integrated on the microprocessor chip, or by a separate ADC unit residing on signal processing board 502. Raw analog signals generated by photodetector/spectrometer B503 may constitute photometric data, wherein the photometric data may comprise spectral information, or at least integrated light intensity information. The photometric data in turn relate characteristics of the coating, in the uncured or cured state, such as total reflectance, spectral reflectance, and indirect measurements such as film thickness and roughness. Conversion of photodetector signals into binary format may constitute photometric data, read by microprocessor B501.

Consequently, microprocessor B501 may issue motor control commands generated by one or more algorithms embodied in software stored in a RAM or ROM accessible by microprocessor B501, where the algorithms process the output of photometric data from photodetector/spectrometer B503. Commands issued by microprocessor B501 may be received by motor control electronics board B504 in the form of continuous analog voltage levels or voltage pulses to drive a stepper motor or a dc motor, either type shown schematically by motor 505. Both motor direction and speed may be controlled by motor control electronics board B504. The control circuitry constitutes a closed-loop embodiment of the mobile coating apparatus control system, which is automatic control based on decisions made by algorithms embodied in the software executed by microprocessor B501.

In another embodiment, the mobile coating apparatus control system may be an open-loop control system. Microprocessor B501 is also shown to be in electronic communication with human-readable display B506, whereas motor control electronics board B502 is shown also to be in electronic communication with manual motor control console B507. In the open-loop control scheme, a human operator may read output displayed on human-readable display B506, which may be a serial or parallel input LCD display. In the example shown in FIG. 26, a selection switch B508 is provided to select between manual control or microprocessor control of the motor controller electronics. To facilitate manual coating process control, the analysis algorithms embodied by software stored on a RAM or ROM accessible to microprocessor B501 may be adapted to communicate process optimization recommendations that are electronically displayed to the human operator, using human-readable display B506 disposed on a hand-held or apparatus-mounted innovative portable sensor, as an example. Microprocessor B501 may also be in electronic communication with a wireless network interface (not shown) adapted to transmit data over the internet wirelessly in some embodiments for display on a computing device.

Characters output from microprocessor B501 to human-readable display B506 may be in a format understandable to the human operator, and indicate, for example, recommendations of motor speed and/or direction may be controllable by the human operator, in order to maintain optimized coating quality. The decision as to what speed the apparatus should be travelling along the substrate, for example, may be based on photometric data generated by photodetector/spectrometer B503. By way of example, the photometric data may indicate coating thickness, which may be dependent on the speed of the apparatus. These recommendations may also include exhortations to decrease the viscosity of the coating solution, and or change the make-up coating to optimize coating performance. In the open-loop control embodiment, control data are output to the human operator by means of human-readable display B506. The human operator may read and interpret the control data, and control the speed and direction of motor B505 by means of manual motor control console B507. Rotary manual speed control B509 may comprise a potentiometer or a rotary encoder. Other forms of manual control may be used, such as a linear slider potentiometer. Double throw switch B510 may be manipulated to control motor direction, causing the mobile coating apparatus to advance in the forward direction or reverse.

EXAMPLE OF METHOD OF USE

An example of how the instant innovation is employed will now be described. A substrate such as a photovoltaic panel may be deployed in an array or individually in an outdoor setting. It is desired to retrofit the panel with an anti-reflective coating, for which a coating apparatus of the type disclosed in co-pending U.S. Non-provisional patent application Ser. No. 14/668,956 is provided. This coating device may comprise wheels and coating heads such that it may be deployed to roll over a photovoltaic panel and deposit a liquid coating pre-cursor solution that is to be cured after application.

An operator equipped with a portable version of the innovative portable light reflectance sensor may deploy it on the panel surface before the coating is applied, to obtain a baseline measurement of percent reflection of incident light as the photometric data. After the baseline measurement, the coating is applied by the coating apparatus. A second percent reflection measurement is then taken. Data from both measurements are digitized by the signal processing circuit and stored in an on-board memory.

The data are then processed by the signal processing circuitry on-board the instant portable sensor, as described above, where the two measurements are compared. A change in percent reflection obtained, with data from the second measurement correlated to the state of the newly applied coating solution. The signal processing circuit then displays the information to the operator. If the coating is too thick or thin, instructions or recommendations are displayed to the operator as a method of feeding back to the operator in control to adjust the speed of the coating apparatus, or to alter the viscosity of the coating solution. The information may also be conveyed by connection to a laptop computer, or wirelessly to a smart phone in possession of the operator at the site, or to personnel at a remote site.

The embodiments of the innovation disclosed and described above are exemplary, and by no means are meant to be construed as limiting the innovation. It is recognized by persons skilled in the art that other variations are possible without departing from the scope and spirit of the innovation, as claimed in the claims below.

The tunable coating property aspect of the instant invention may be derived in part through variations in the deposition process, preferably by varying the thickness of the coating. The tunable coating property aspect of the instant invention may be derived in part from variation of the final composition of the coating, which in turn is determined by the relative amounts of precursors in the wet coating precursor solution, or precursor ratio, can be selected from a continuum of precursor ratios disclosed herein to produce desired coating characteristics. Preferably, the concentration of the siloxane component is changed to yield desired properties. Siloxanes or hardcoats are available through a variety of manufacturers. An example of a hardcoat is poly dimethyl siloxane (PDMS) and derivatives.

Formulation

The dry content composition of the inventive AR coating may comprise the following composition ranges in terms of solids content (dry weight percentages):
Matrix/Silicate: 60-100%
Siloxane: 0-20%
Nanoparticles (hollow and/or solid): 0-20%
More preferably, the dry composition may comprise the following ranges:
Matrix/Silicate—76-90%
Siloxane—5-12%
Hollow NP—5-12%

General Coating Precursor Solution

The matrix sol gel precursor is derived from base-catalyzed hydrolysis of an organic orthosilicate, for example tetramethyl orthosilicate (TMOS) or tetraethyl orthosilicate (TEOS). Sol gel creation from organic orthosilicates such as TMOS and TEOS is well known in the art, and the exact concentrations and final pH adjustments of the acid and base catalysts can vary. Many examples of particular conditions can be found in both the patent and scientific literature.

One embodiment of the coating precursor solution is formulated as a mixture of the following at room temperature:
Organic orthosiicate (TMOS) sol gel concentration can range up to 50% in alcohol—base-catalyzed.
Hardcoat siloxane concentration can range up to 50% in alcohol
Hollow-spherical nanoparticle (HSNP) concentration can range up to 50% as an alcoholic suspension.
wherein the alcohol may comprise any one of C1 to C10 alcohols and mixtures thereof. Any suitable solvent known to those skilled in the art may be used.
The volumetric ratios of the individual coating precursor solutions may be adjusted to yield precursors having the following concentrations based on ratios of one to the other or final percentages in solution:
HSNP 0-20%
Hardcoat 0-20%

Example of Low Temperature Curing AR Coating Composition

A low temperature curing AR coating solution composition comprises the following components. Base-catalyzed orthosilicate tetramethyl orthosilicate (TMOS-b) system is prepared, by mixing TMOS, water, methanol or ethanol, and a base catalyst that may include any of the following basic compounds: ammonia, organic amines ($RNH_2$, $R_2NH$, $R_3N$, where $R=C_{1-3}$ alkanes), basic amino acids (arginine, lysine) and quaternary ammonium halides, preferably where the quaternary ammonium ion has the formula $RNMe_3$, where $R=C_{6-12}$ alkanes. Preferably, a pre-mixture of 4:1 TMOS-b: binding agent is prepared. TMOS-b tends to polymerize into long linear chains and does not extensively cross-link. Preferably, a binding agent that undergoes hydrolysis during curing, forming linear or branched structures at low temperature, occurring readily under 100° C., is added as well. In the inventive energy transmission enhancement coating composition, the binding agent may be used as a minority reagent in combination with TMOS-b to provide for the cross-linking of the long linear silicate chains made by the polymerization of TMOS-b. The combination of the binding agent and TMOS-b in the composition disclosed advantageously cures to form hard scratch resistant coatings at substantially lower temperatures for less curing time than previously disclosed coatings of similar composition.

Figure 10:
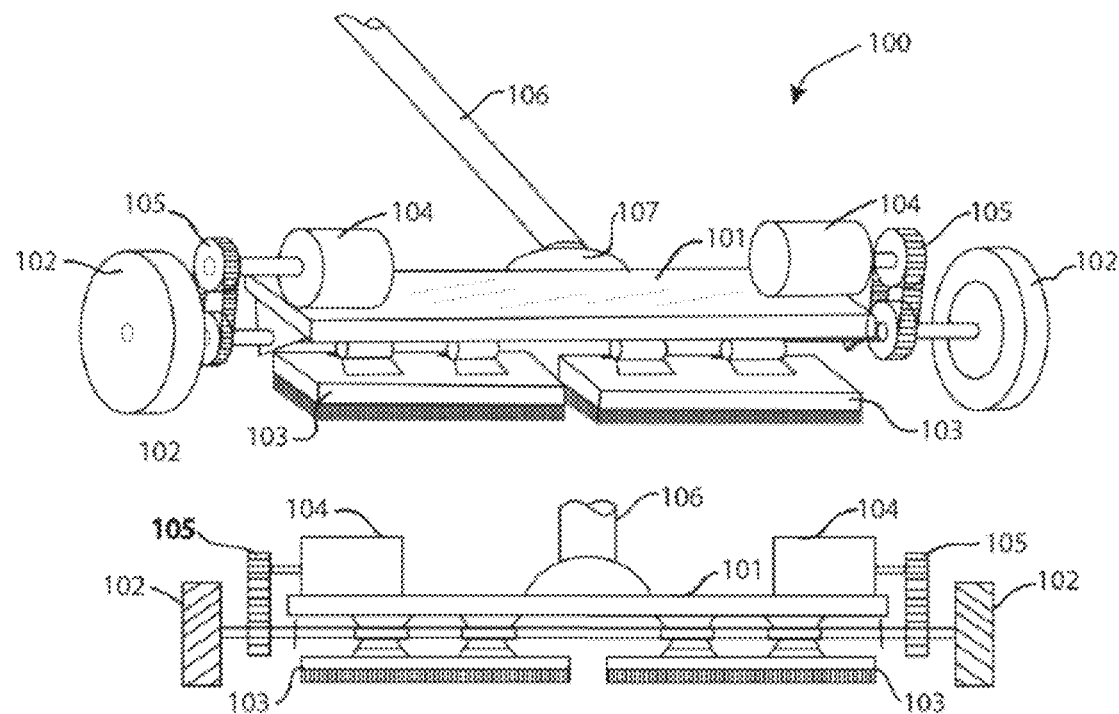
FIG. 10 View of a possible embodiment of the portable coating assembly. Oblique view and frontal view shown.
Figure 11:
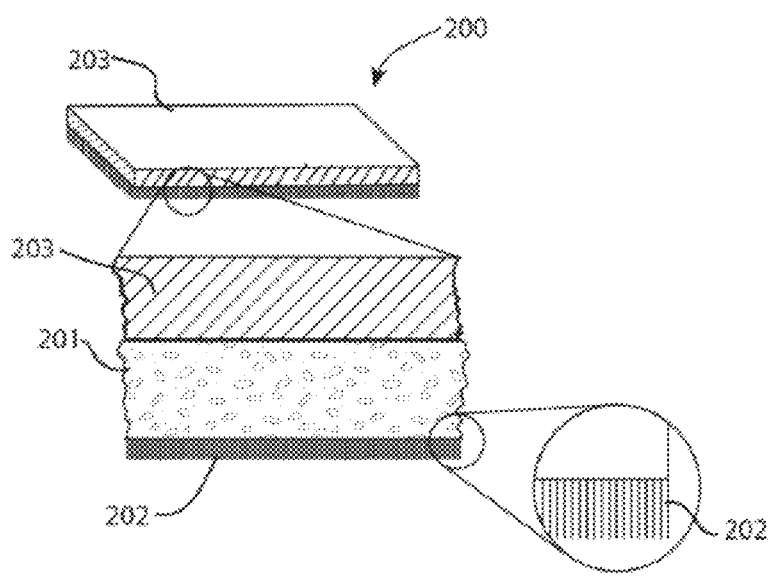
FIG. 11 Detailed view of coating applicator mechanism construction, showing the deformable core and capillary interface layer arrangement.
Figure 12A:
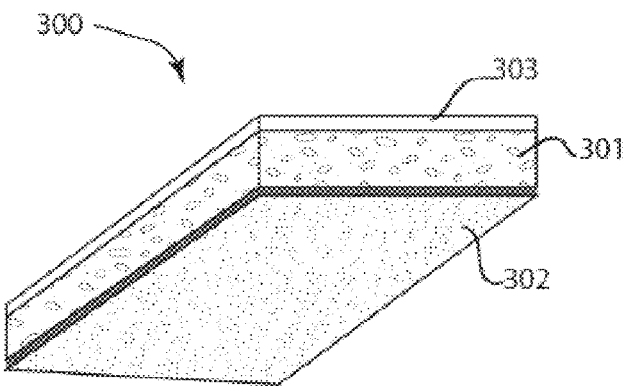
FIG. 12a Bottom oblique view of deformable core of coating applicator mechanism.
Figure 12B:
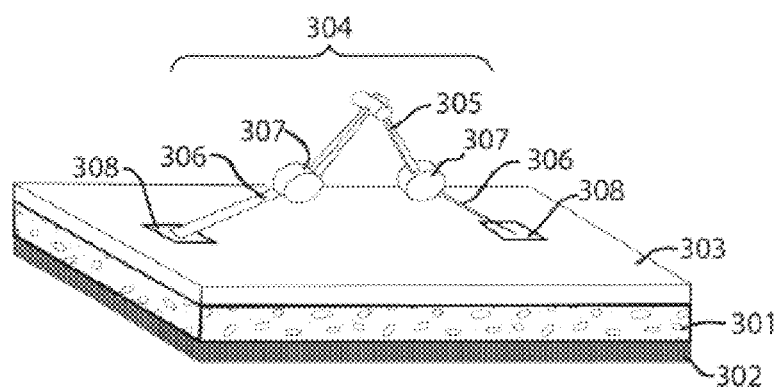
Figure 12C:
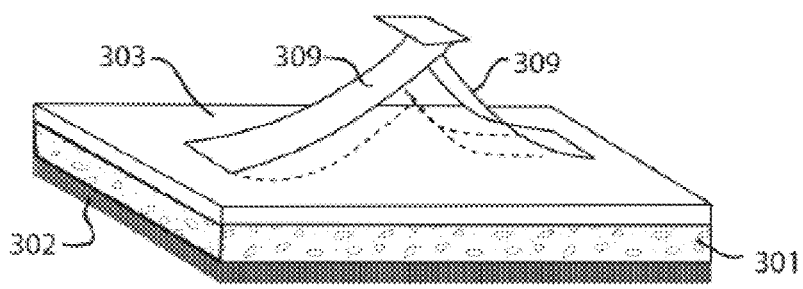
Figure 12D:
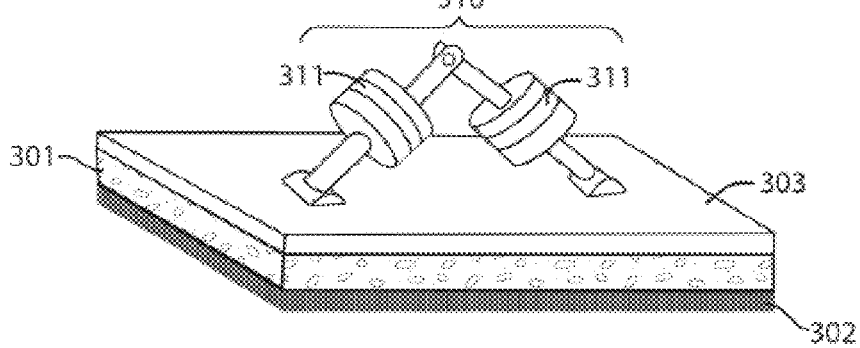
Figure 13:
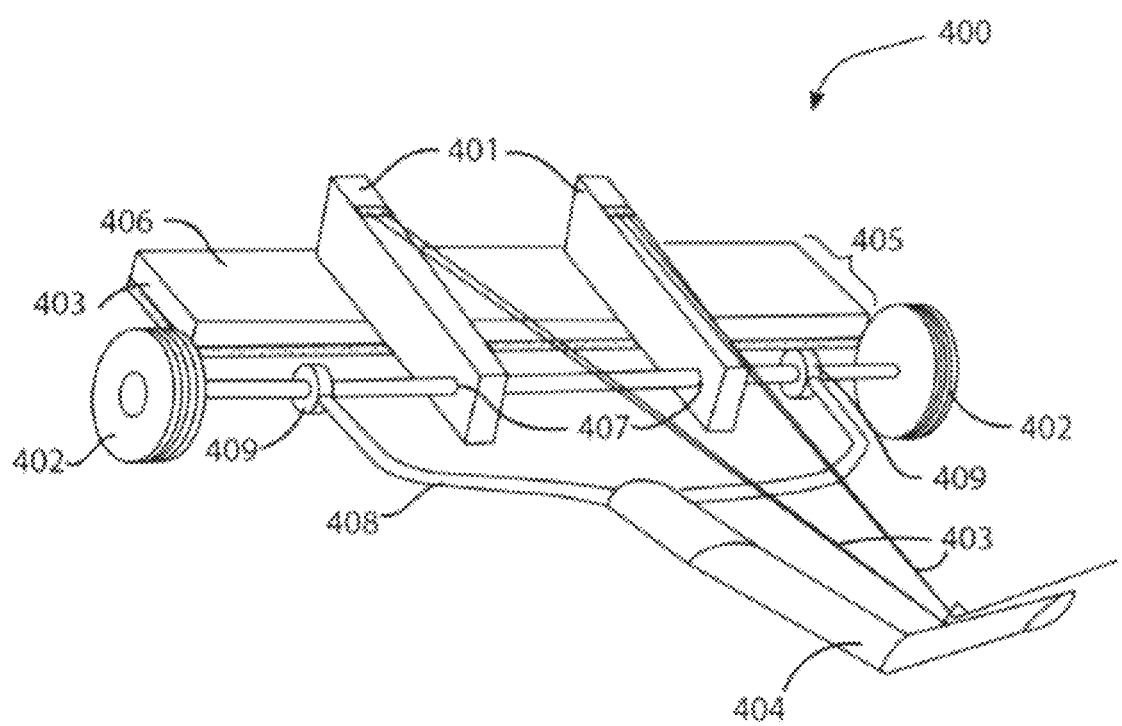
FIG. 13 Top oblique view of manually controlled embodiment of the inventive portable coating assembly.
Figure 14:
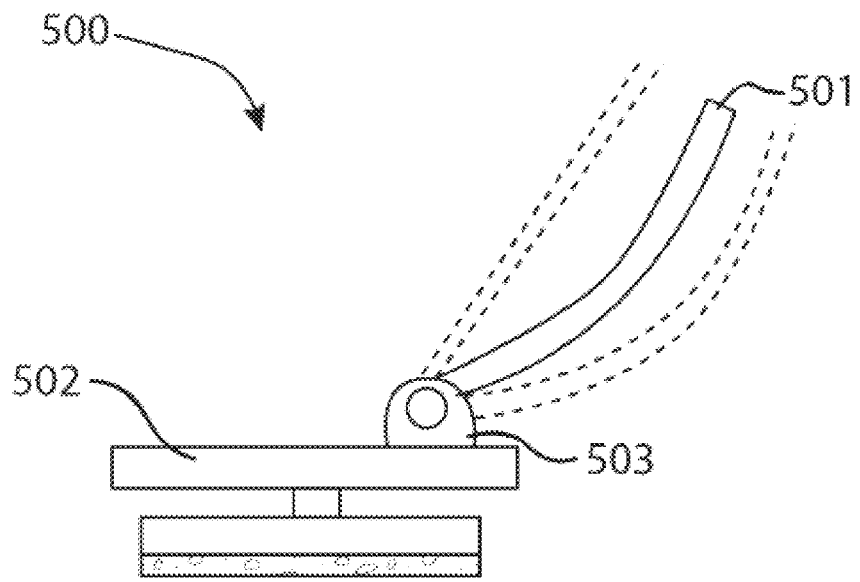
FIG. 14 Side view of manually controlled embodiment of the inventive portable coating assembly, having a flexible handle structure, having a bendable leaf spring action to mitigate vertical forces.
Figure 15:
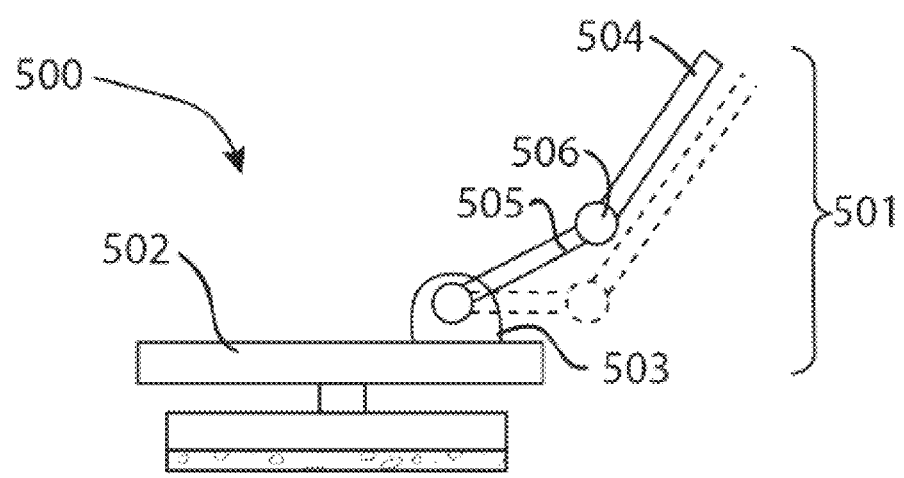
FIG. 15 Side view of manually controlled embodiment of the inventive portable coating assembly, having a flexible handle structure, having a bendable lever spring action to mitigate vertical forces.
Figure 16:
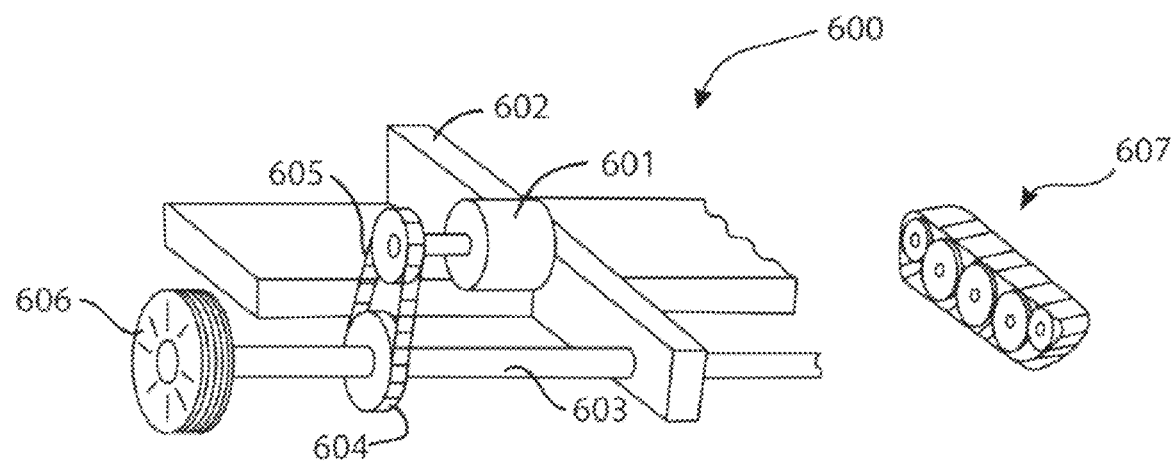
FIG. 16 Details of motorized drive coupling to drive axle.
Figure 17:
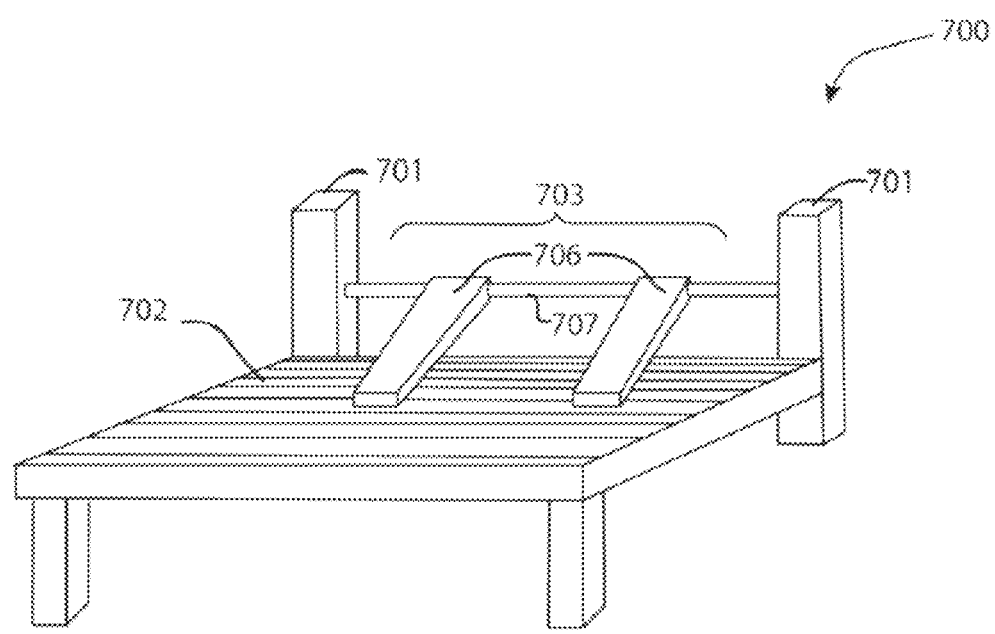
FIG. 17 Top oblique view of portable coating assembly service station embodiment for transferring coating solution to coating applicator heads.
Figure 18:
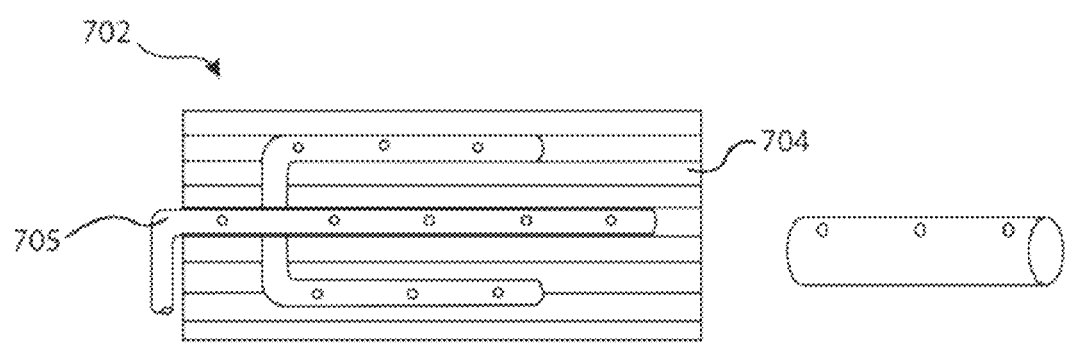
FIG. 18 View of bottom side of dosing platform component of portable coating assembly services station.
Figure 19:
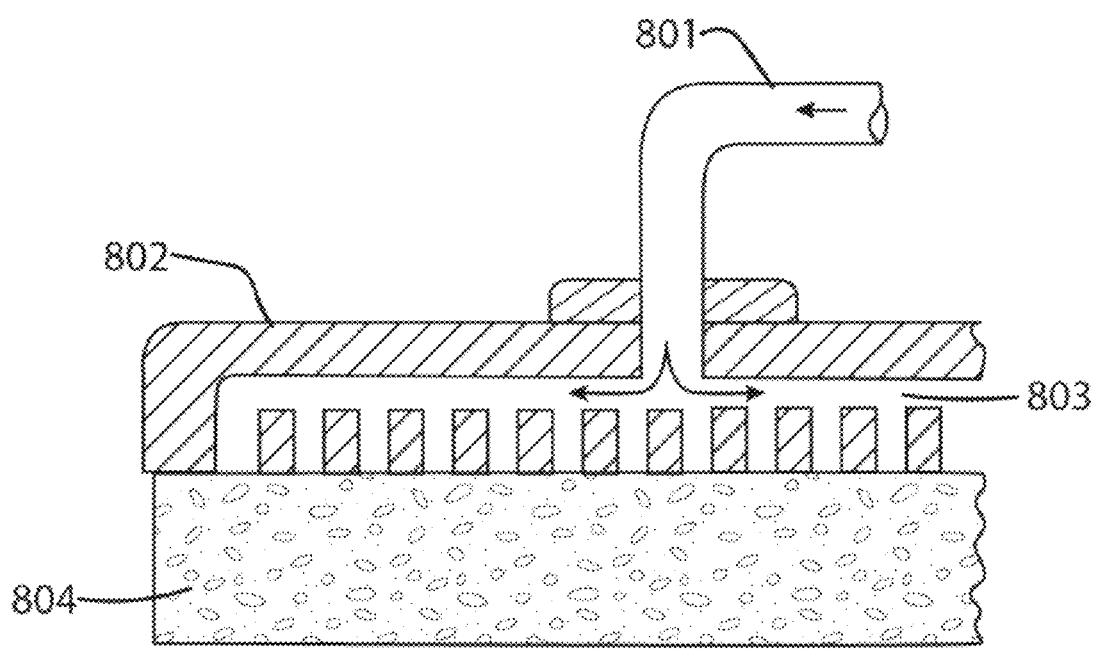
FIG. 19 Sectional view of alternative embodiment of coating applicator head, adapted for delivery coating precursor solution by pumping means to a distribution manifold built into the coating applicator mechanism.
Figures 20A, 20B:
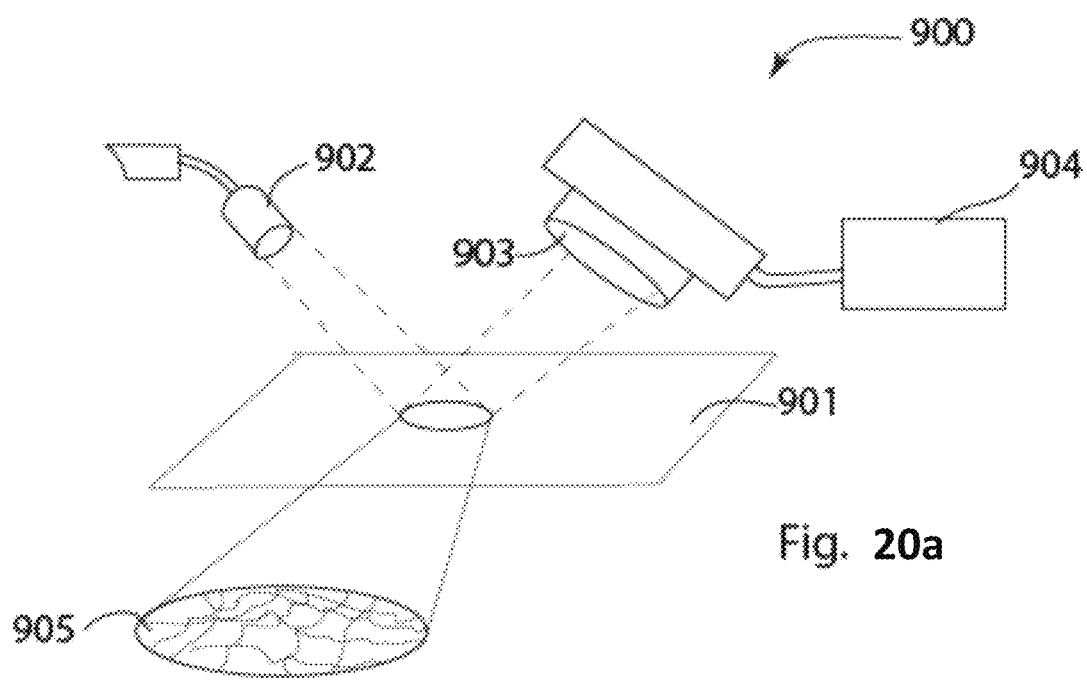
FIGS. 20a and 20b a) Operational diagram of a photometric sensor. b) zoom view of an illuminated portion of a substrate surface (coated or uncoated) showing surface irregularities and non-uniformities.
Figure 21:
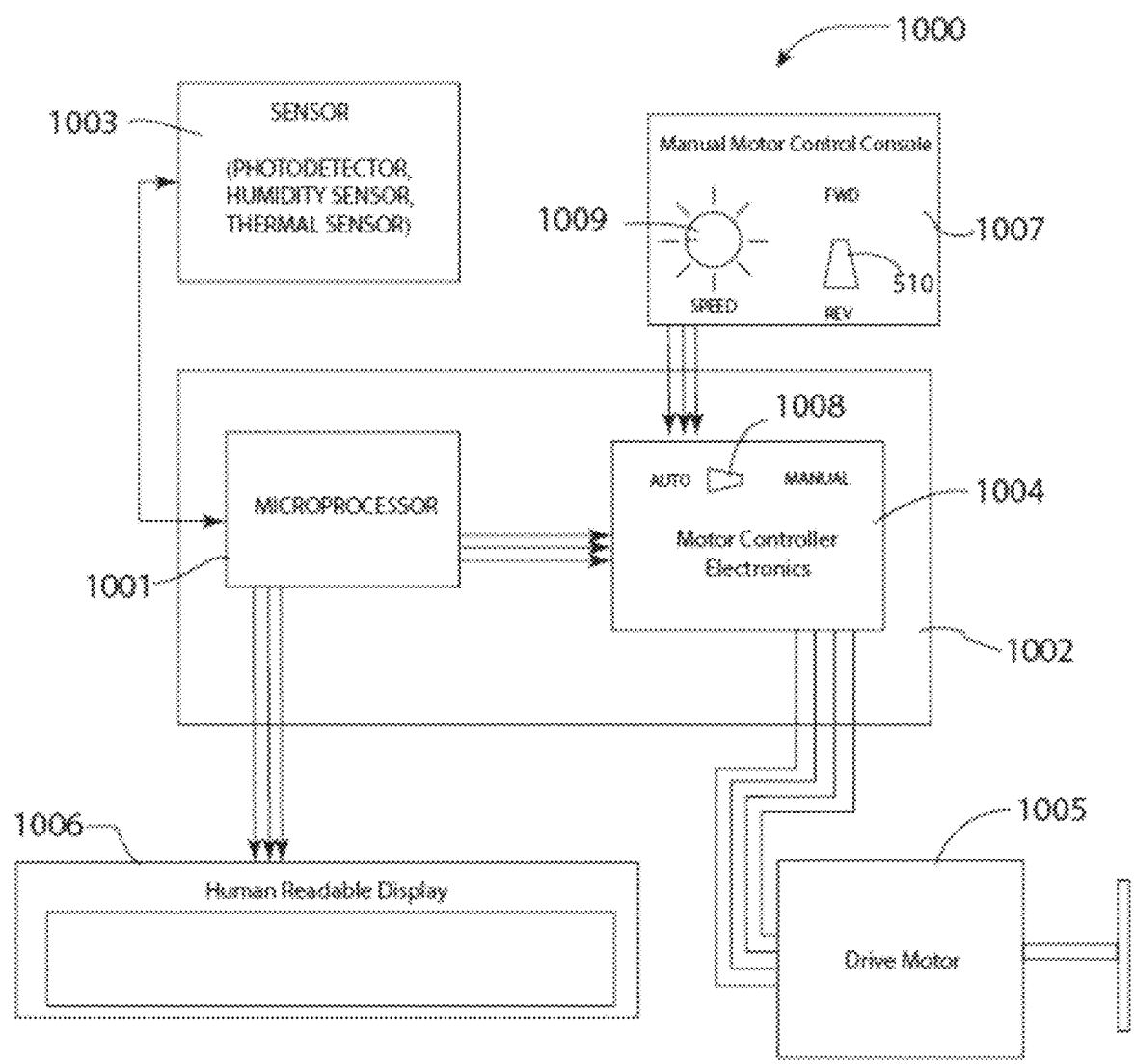
FIG. 21 Schematic diagram of an exemplary electronic control system embodiment for controlling a mobile coating apparatus using both closed- and open-loop feedback.

The novel AR coating composition further comprises organosilane additives for improvement of hydrophobicity, and any of the organosilanes having the structure $(R_1)_n Si(OR_2)_{4-n}$ ($R_1$, $R_2$: $C_{1-3}$ alkane, alkene, n=0-3) and $RSiCl_3$ (R: $C_{1-3}$ alkane, alkene) have been found to may be added in varying ratios to the binder:TMOS-b mixture. Optical properties of the coatings are controlled using both solid and hollow sphere silica nanoparticles, described below. In other embodiments, no nanoparticles are added to the mixture. Low temperature-curable coatings according to the invention form high transmittance and excellent abrasion resistance (see FIGS. 8-10) when cured at, for example, 40° C. for 24 hours, 50° C. for 8 hours, 65° C. for 4 hours, 150° C. for 1 hour,. This contrasts more typical curing regimes of curing temperatures ranging between 90° C. -700° C. for 10 minutes or less for the higher temperatures, up to five hours for the lower temperatures. Such a treatment may yield a film thickness ranging between 50-250 nm. Other thermal treatment regimes, as well as more exotic plasma and microwave methods are not excluded.

Formulations for the low temperature AR coating solution compositions may comprise the following ranges:
Without nanoparticles
TMOS-b (Matrix/Silicate): 50-95%
Binder: 5-50%
With nanoparticles
TMOS-b (Matrix/Silicate): 60-90%
Binder: 5-20%
Nanoparticles (hollow and/or solid): 5-20%

Nanoparticle Addition

It may be desired to incorporate added hollow silica nanoparticles to the precursor coating solution. Syntheses of hollow spherical silica nanoparticles are well known in the art. Many examples of silica HSNP can be found in both the patent and scientific literature. Procedures to synthesize hollow nanoparticles are abundant in the patent and scientific literature. In terms of size, the hollow nanoparticles can range between 5 to 200 nm. In terms of distribution, the hollow nanoparticles can be within a narrow size range, or within a bimodal size range, a trimodal size range, multimodal or completely random size distribution. In addition to hollow nanoparticles, solid nanoparticles may be incorporated into the film. One such method is to procure solid nanoparticles from a commercial source and incorporate them into the solution mix prior to making the film.

Incorporation of pre-synthesized nanoparticles creates additional costs to manufacture the innovative coating precursor solution. Preferably, the instant coating precursor solution does not incorporate the addition of pre-synthesized nanoparticles, and instead produces a coating where nanoparticles may form spontaneously.

Example of Coating Panel Substrates on in the Field

The coating deposition comprises mixing the individual coating precursor components together to form the coating solution. The coating solution is then deposited on a substrate using a coating apparatus adapted to coat substrates such as photovoltaic panels and solar thermal panels already existing in a field installation. Such a coating apparatus is described in detail in the US Utility Patent referenced earlier and incorporated herein by reference in its entirety, but coating apparatuses for the purpose of this disclosure are not limited to any particular type, and in general comprise a coating distribution means. The coating distribution means include, but are not limited to, spray coating nozzles, brushes and contact applicators of the like. This point is explained below. By virtue of the capability of the inventive coating precursor solution to cure at temperatures well under 100° C., the ability to retrofit or re-coat substrates in existing installations with an optical coating, such as an antireflective coating, is provided. This improvement eliminates the need to dismantle the substrate from the installation to send it to the factory of origin or to a special facility for coating, avoiding a costly and disruptive maintenance procedure. The installations referred to in this disclosure comprise a single substrate, such as a single individual photovoltaic panel, or an array of multiple panels, as in a photovoltaic array. The term "array" is meant to be understood to consist of a single panel or multiple panels. Substrates may be extended to include solar thermal panels, regarded individually (single panel arrays) or in multi-panel arrays. In addition, glass window panes installed in residential and commercial buildings are included in the definition of substrate as well for the purposes of this disclosure.

A coating apparatus may be a standard one known in the art to make thin-film coatings, such as, by way of example, a roll coater, spin coater, dip coater and spray coater. The coating process may be carried out at ambient temperatures, but temperatures both above and below ambient are not excluded. Coating thickness may be controlled by certain coating parameters such as the viscosity of the coating solution, speed of a moving substrate, and/or the curing process, as described below.

Most preferably, the coating is applied to a substrate, such as a solar photovoltaic panel installed in an outdoor photovoltaic array, by use of the coating apparatus described earlier. The coating apparatus is adapted to deposit an optical thin-film coating layer of uniform thickness by use of innovative coating heads, or brushes, on substrates such as photovoltaic panels in both indoor and outdoor installations. For the purposes of this disclosure, the substrate is disposed in an ambient, where an ambient can be defined either as an indoor or outdoor environment. "Outdoors", or "out of doors" is defined as being outside, or disposed in the open environment, whereas "indoors" is defined as being inside, or disposed in the interior of an enclosed structure, such as a building. For purposes of this disclosure, "field" is used, such as "field-coated", to mean the coating process takes place outside of a facility where the substrate would normally be manufactured, and rather the inventive coating process occurs in an individual or array installation of the substrate, typically out of doors.

An example coating procedure is the following:

A substrate is provided, where the substrate can be any one of the following: a photovoltaic panel, a solar thermal panel, a glass pane. In practical terms, the substrate may be referred to as a panel or pane, and may be part of an existing installation, either as a single panel or multi-panel array, for photovoltaic and solar thermal installations, or as glass windows installed in a structure. As discussed above, a coating apparatus is provided, comprising a coating distribution means. Such a coating distribution means may be based on a brush methodology where the coating distribution means is an applicator head having one or more brushes in intimate contact with the substrate surface, applying a uniform layer of liquid coating precursor solution on the substrate. Such a coating means is described in detail earlier in this specification. Alternatively, the coating distribution means may be based on a spray methodology, where one or more spray nozzles are used to apply a uniform layer of optical-coating precursor solution to the substrate, where the nozzles are positioned at a distance above the substrate surface.

The coating apparatus may be positioned on the substrate surface, which for photovoltaic panels or solar thermal panels, may be inclined at an obtuse angle with respect to the vertical. As an example, the coating apparatus may be placed on the lower end of the panel. The coating apparatus may be hand-driven, in which case it may have an elongated handle attached to it. An operator may then move the coating apparatus along the substrate surface in an excursion from the initial position to the upper end of the substrate. For a brush applicator, the one or more applicator heads may be engaged on the surface during the excursion. Alternatively, the applicator heads may be engaged during the return excursion, or during both excursions. The coating apparatus may also be adapted to move in a grid pattern, being displaced laterally. The foregoing is also true for a coating apparatus having a spray distribution means.

A thin film layer of the inventive precursor solution is then applied to either the entire surface of the substrate, or a portion thereof, with a substantially uniform thickness. Preferably, the precursor layer is of such a thickness that a cured coating thickness of 50-250 nm will result. Moreover, the coating may be deposited in a single pass or by multiple passes, where the same or different coating precursor solution is deposited over a previous coating layer of the same composition. In preferred embodiments, the innovative coating is prepared as a single-pass layer or a double-pass layer. Preferably, the coating apparatus is motorized, where a motor drive is engaged with the traction means of the coating apparatus, and provides a constant speed of translation of the apparatus. The constant speed is preferable, as the rate of deposition of the layer is a strong function of the speed of translation of the apparatus. By precise control of the speed of the coating apparatus during its coating excursions, the final thickness of the layer is well controlled and spatially uniform. This is best done by a motorized coating apparatus. In this manner, the thickness may readily be tuned to ¼ wavelengths of target portions of the solar spectrum or other ambient lighting. Alternatively, the thickness may be tuned to another optimum thickness or thickness range favoring the performance enhancing characteristics of the coating.

The precursor layer may now undergo a curing step, wherein the substrate, as part of an outdoor installation, is passively cured out of doors in the sun at ambient temperatures. Preferably, the substrate surface temperatures range from 10° C. to over 100° C. Surface temperatures such as those figuring in the quoted range may be engendered by ambient sunlight, and related to air temperature, which is primarily dictated by weather conditions, season and geographic location. According to the innovation, the warmer the substrate surface temperature, the faster the curing process occurs.

Alternatively, the curing process may take place under conditions of low light levels, or in the dark entirely, as the curing chemistry is a thermal process. As an example, a coated substrate in an outdoor installation may be cured under cloud cover, or at night. Moreover, the substrate may be cured indoors, where the surface temperature is approximately the ambient temperature.

The surface in the case of the photovoltaic film is uneven, but the innovative coating forms a smooth optical film. The innovative coating is a single layer coating, as explained above, being substantially compositionally homogeneous across its thickness.

Optical Performance

Figure 28:
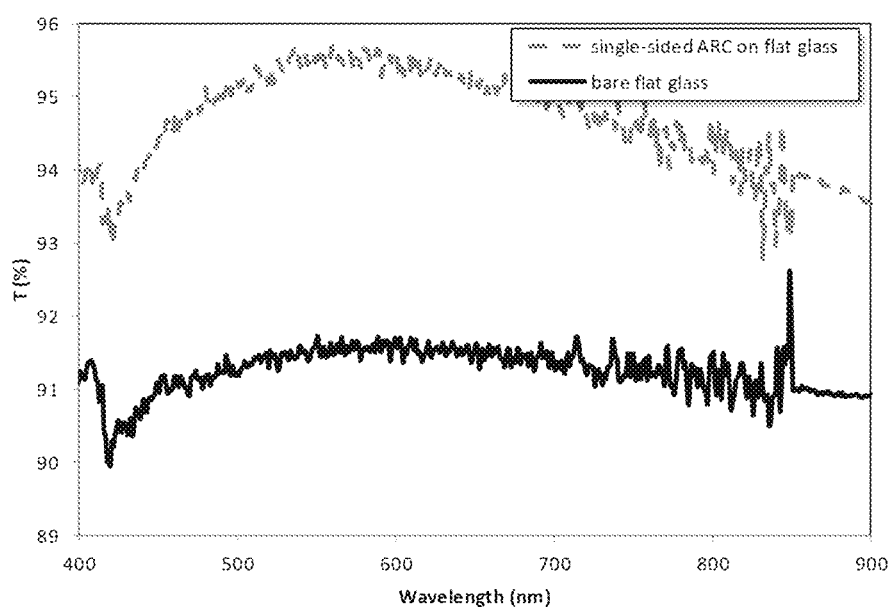
FIG. 28. Transmission spectral comparison between coated (inventive AR coating) and uncoated smooth glass substrate.

The effect of using the inventive AR coating on glass and plastic substrates is shown in FIGS. 5-7. In FIG. 28, the visible wavelength transmission spectra are shown for a smooth flat window glass substrate. The upper curve represents the glass substrate coated with the inventive energy transmission enhancement coating, in this case intended as an AR coating, on one side. The data show an improvement of transmission (Delta T) of up to 4% between 500 and 600 nm, and minimum 3% elsewhere, with an average gain in transmittance of 3.65%.

Figure 29:
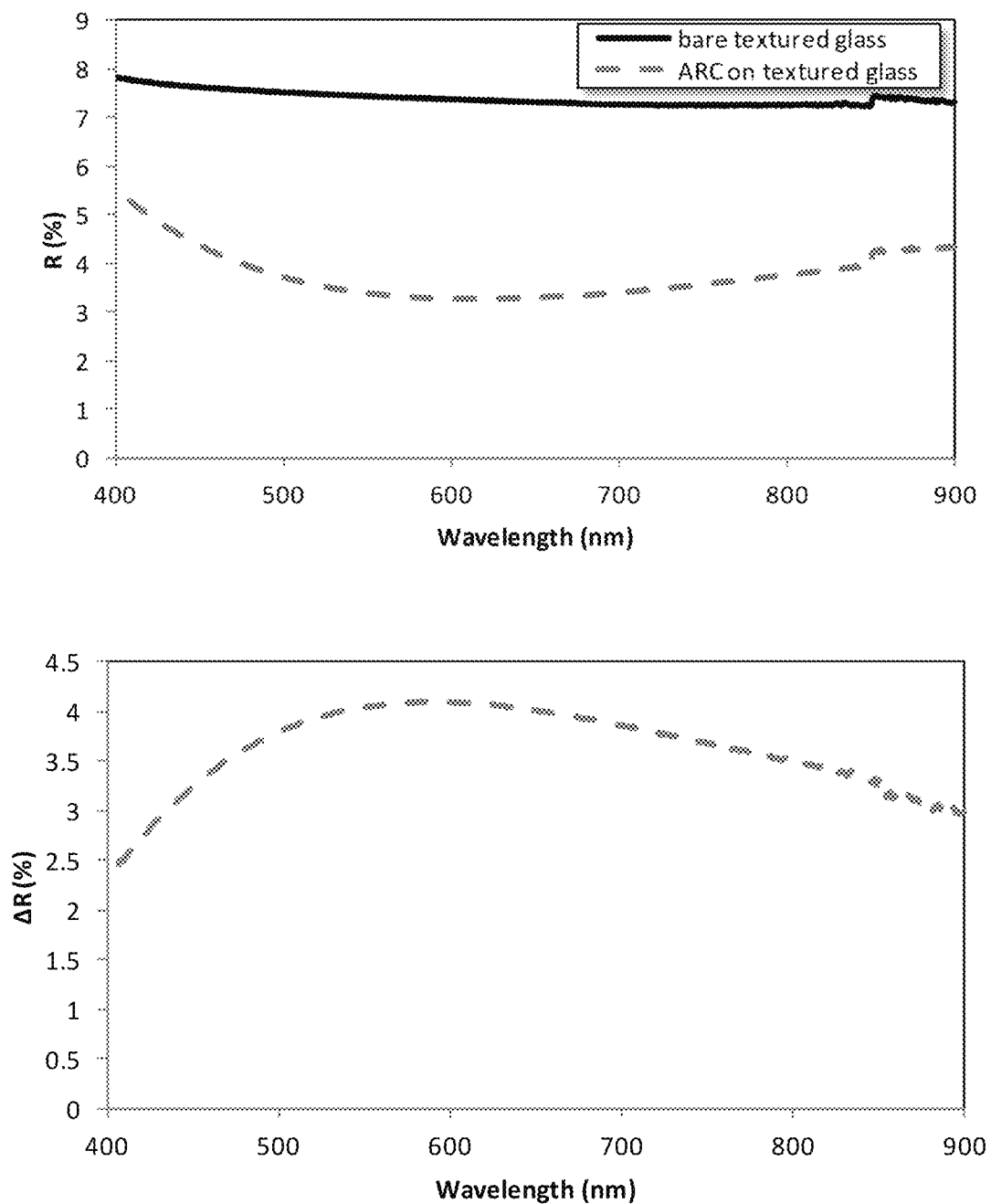
FIG. 29 Transmission spectral comparison between coated and uncoated textured glass substrate.

Direct reflectance measurements on textured glass are shown in FIG. 29. Here, the data show the decrease in reflected light (upper graph, dashed curve) across the visible spectrum due to the presence of the inventive energy transmission enhancement coating. The average decrease is 3.73%. In the lower graph of FIG. 29, the dashed curve represents the change in reflectance from the surface of the substrate coated with the innovative coating.

Figure 30:
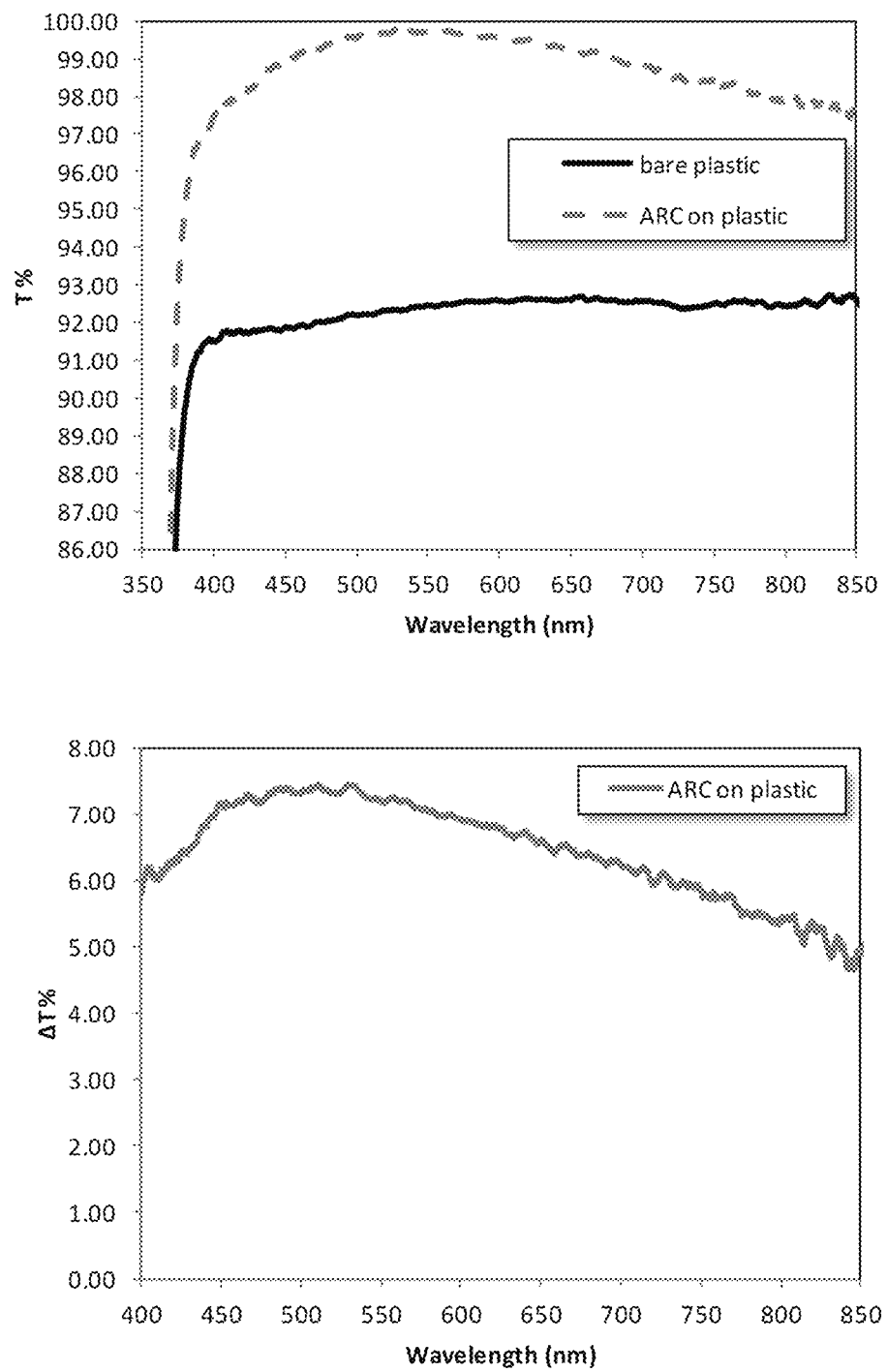
FIG. 30 Transmission spectral comparison between coated and uncoated smooth acrylate (PMMA) substrate. Upper graph shows comparison of the transmission spectra of the uncoated and coated substrate, and lower graph shows % Delta T.

FIG. 30 shows the effect of the inventive energy transmission enhancement coating on both sides of an acrylic (PMMA) substrate. The comparison between the coated transmission spectra of a PMMA substrate with the innovative coating (dashed curve) to the same substrate uncoated (solid curve) is shown in the upper graph. The lower graph of FIG. 30 shows that the inventive coating resulted in an average increase of transmittance of 6.75% across the visible spectrum from 400 to 750 nm.

Figure 31:
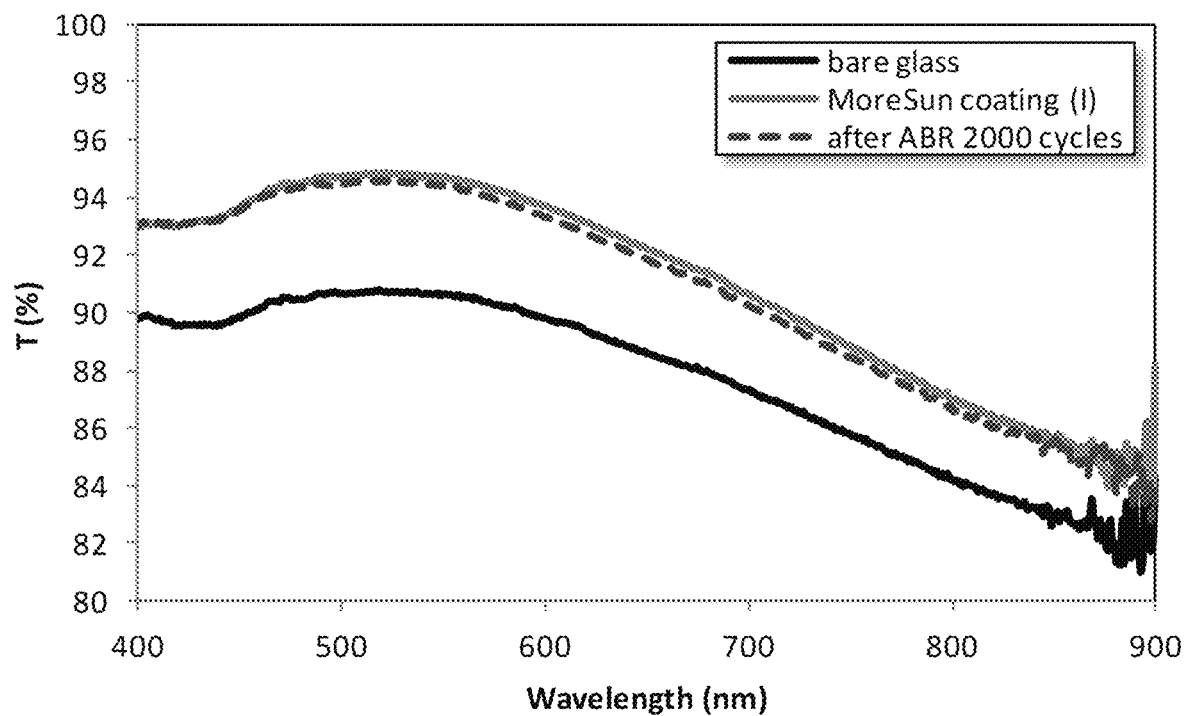
FIG. 31 Results from abrasion scrub test. Comparison of transmission spectra of virgin single pass coating and same after abrasion scrub test. See text for test conditions.

Abrasion resistance of the low-temperature curable energy transmission enhancement coating is demonstrated in FIG. 31. The abrasion scrub test experiments were carried out with 2000 strokes of a brush meeting ASTM D2486 standards with 500 g of force over the coating. FIG. 31 shows the transmission spectrum of a single layer of the inventive AR coating over the wavelength range between 400-900 nm, before and after the abrasion test, where the solid red curve represents the spectrum of a virgin single-pass coating before the abrasion resistance test, and the broken curve was measured after the abrasion test.

Figure 32:
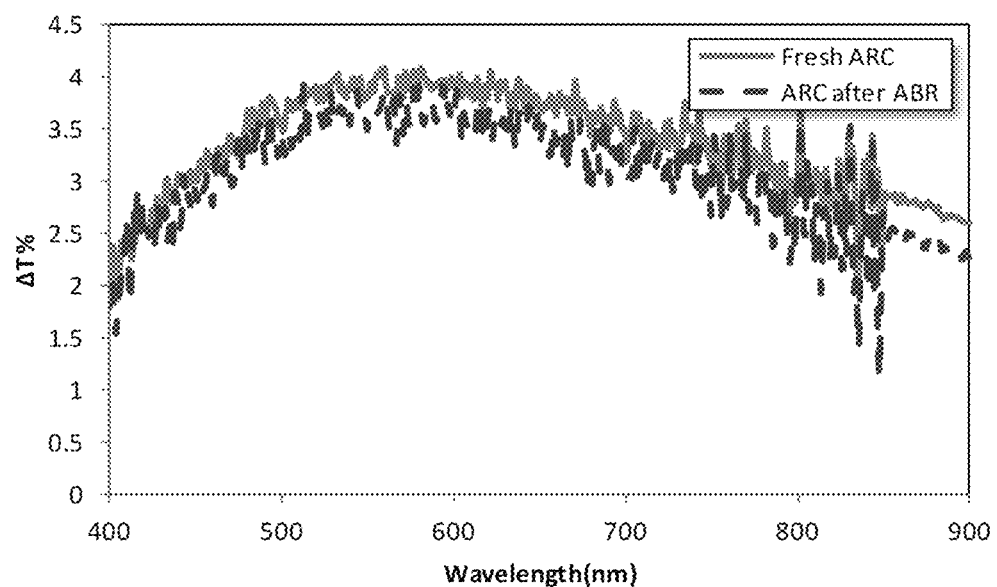
FIG. 32 The change in transmittance (% Delta T) of the innovative coating after the abrasion scrub test. Same substrate as in FIG. 31

FIG. 32 compares the change in transmittance over the indicated spectrum for the coating before and after the abrasion test. The data show only a 0.3% average decrease in the transmission of light after completion of the abrasion resistance test, indicating that over 90% of the virgin film was retained after the test, therefore demonstrating that the single-layer film has a high degree of scratch resistance. The lower solid curve represents the transmission spectrum of the bare glass substrate, showing that the AR coating provides for an average of a 3.5% increase in light transmission through the substrate, almost full suppression of reflection by the novel AR coating.

Figure 33:
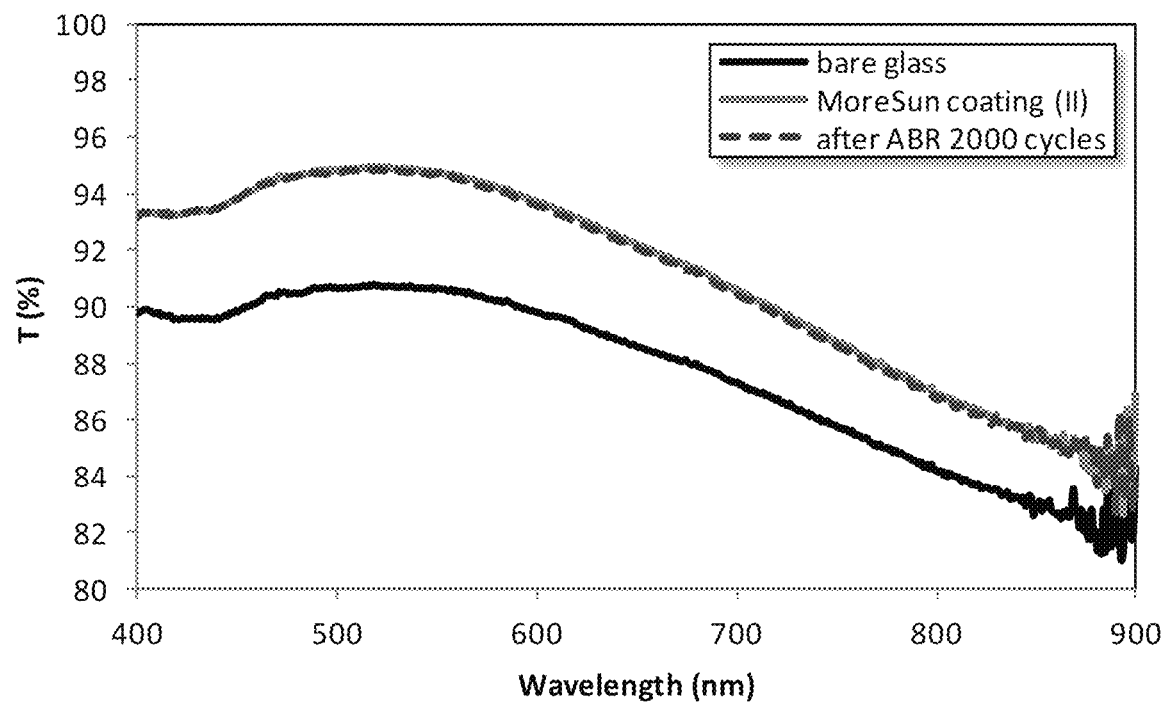
FIG. 33 Results from abrasion scrub test on a double-pass coating. Comparison of transmission spectra of virgin double-pass coating and same after abrasion scrub test.

FIG. 33 shows results from the same abrasion scrub test applied to a double-pass energy transmission enhancement coating. Again, the solid red curve shows the transmission spectrum of the virgin double-layer coating, and the broken curve is the resulting transmission spectrum after the abrasion test. The data here show that the change in the optical characteristics is only about 0.09%, indicating over 97% of the coating was retained. The results here demonstrate that the double-layer coating exhibits a greater degree if robustness than the single-layer.

Figure 34:
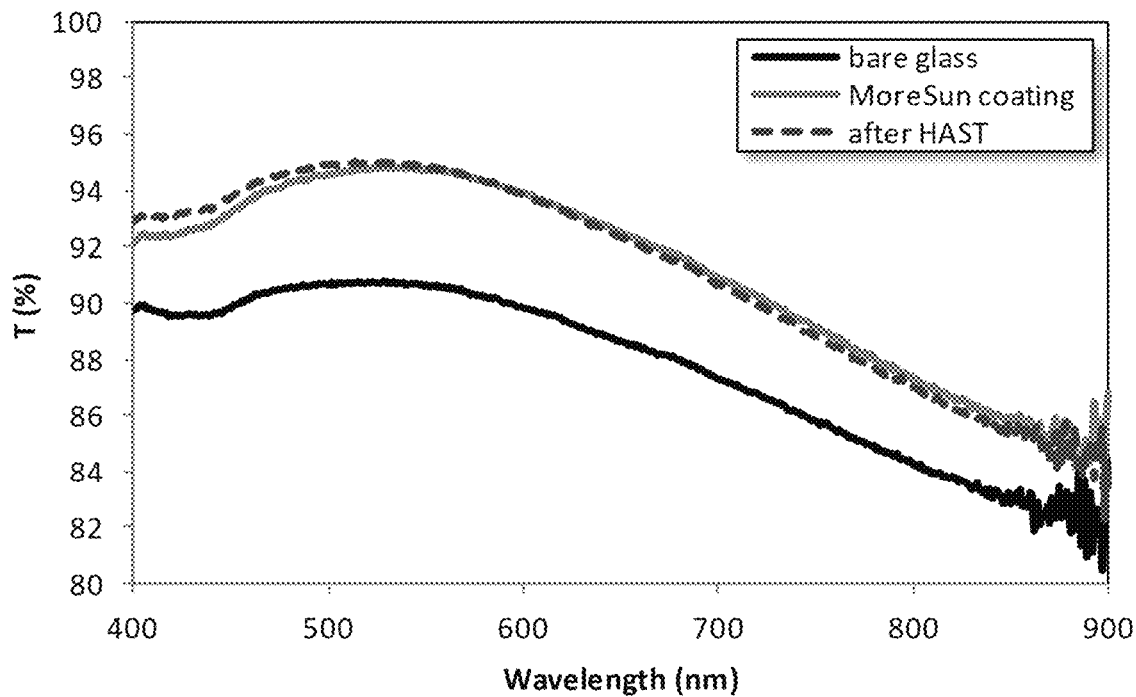
FIG. 34 Results of HAST testing. A single-pass coating subjected to HAST conditions. See text for test conditions.

The moisture degradation performance of the inventive films is measured and shown in FIG. 34. The data in this figure are taken from subjecting the inventive AR coatings to conditions dictated by the industry-standard Highly Accelerated Stress Test (HAST). In this test, the coatings were subjected to high temperature of 140 C, 85% humidity at approximately 30 psi (2 atmospheres) of pressure. Under these conditions, the HAST test simulates humidity degradation over a 20 year period. The solid red curve of FIG. 34 is the optical transmission spectrum of the coating on a glass substrate before the test. The blue curve is the transmission spectrum of the coating after the test, whereas the lower solid curve is the transmission spectrum of the bare glass substrate. The results here show that the before and after change of transmission characteristics of the coating is about 0.06%, which indicates that over 98% of the coating was retained after the HAST process.

While the forgoing embodiments disclosed above describe the invention in its various manifestations, the foregoing embodiments are to be understood by persons skilled in the art as exemplary in nature, and are in no way intended to be construed as the only embodiments possible for the invention. Those skilled in the art will also understand that other embodiments and examples of deployment of the inventive AR coatings are conceivable and possible without departing from the scope and spirit of the invention.

What is claimed is:

1. An apparatus for forming a nanostructured performance enhancement thin film coating on an array of sloped outdoor panel surfaces comprising:
   A. A meniscus drag coating applicator comprising:
      i. at least a first meniscus drag deposition mechanism and at least a second meniscus drag deposition mechanism for depositing a performance enhancement coating solution onto the sloped outdoor panel surfaces, with each meniscus drag deposition mechanism comprising:
         a. at least two materials of different capillary attraction for the performance enhancement coating solution, wherein one material has a lower capillary attraction for the performance enhancement coating solution than the other material;
         b. a mechanism for raising and lowering the meniscus drag deposition mechanism so that it contacts the surface of the outdoor panels in the lowered position and does not contact the surface of the outdoor panels in the raised position;

c. at least one fluid manifold for distributing the performance enhancement solution to the at least one material of lower capillary attraction, wherein the solution transfers from the manifold to the lower capillary attraction material and then the solution transfers from the lower capillary attraction material to a higher capillary attraction material, wherein the solution transfers from the higher capillary attraction material to the sloped outdoor panel surfaces as the one or more meniscus drag deposition mechanisms are moved across the sloped outdoor panel surfaces;

at least one pump connected to tubing that transfers the solution from at least one fluid reservoir to the at least one manifold;

iii. a means of moving at least one meniscus drag deposition mechanisms across at least a portion of the sloped outdoor panel surfaces during one or more coating passes of the one or more meniscus drag deposition mechanisms across at least a portion of the sloped outdoor panel surfaces;

iv. one or more rolling mechanisms to move the applicator across the sloped outdoor panel surfaces, wherein at least one or more of the roller mechanisms is oriented in such a way as to ensure the applicator remains engaged with the sloped outdoor panel surfaces and does not slide off;

v. wherein the first meniscus drag deposition mechanism is mounted to a first side of the coating applicator and the second meniscus drag mechanism is mounted apart from the first meniscus drag deposition mechanism on a second side of the applicator opposite the first side of the applicator, wherein the one or more of the rolling mechanisms is positioned between the first meniscus drag deposition mechanism and the second meniscus drag deposition mechanism;

vi. wherein an algorithm determines how far to move the applicator between the one or more coating passes, the algorithm comprises the following steps:
  a. aligning the first meniscus drag deposition mechanism with an uncoated area to be coated;
  b. lowering the at least first meniscus drag deposition mechanism so that it contacts the surface of the outdoor panels;
  c. performing a coating pass;
  d. raising the at least first meniscus drag deposition mechanism so that it does not contact the surface of the outdoor panels;
  e. moving the applicator so that the first meniscus drag deposition mechanism is aligned with a subsequent uncoated area to be coated;
  f. lowering the at least first meniscus drag deposition mechanism so that it contacts the surface of the outdoor panels;
  g. performing a coating pass;
  h. raising the at least first meniscus drag deposition mechanism so that it does not contact the surface of the outdoor panels;
  i. moving the applicator so that the first meniscus drag deposition mechanism passes by a surface portion that was previously coated by the at least second meniscus drag deposition mechanism to a further subsequent uncoated area to be coated by the first meniscus drag deposition mechanism;
  j. lowering the at least first meniscus drag deposition mechanism so that it contacts the surface of the outdoor panels;
  k. performing a coating pass;
  l. raising the at least first meniscus drag deposition mechanism so that it does not contact the surface of the outdoor panels; and
  m. repeating the algorithm;

B. a mechanical extension device that enables at least the first meniscus drag deposition mechanism or the second meniscus drag deposition mechanisms to run off at least one end of at one of the surfaces of the sloped panels, wherein the mechanical extension device is integrated with the applicator;

C. a sensor for sensing the temperature of the sloped outdoor panel surfaces;

D. wherein a speed of the one or more meniscus drag deposition mechanisms is dependent on the temperature of the sloped outdoor panel surfaces, wherein the speed of the one or more meniscus drag deposition mechanisms is reduced if the temperature of the sloped outdoor panel surfaces decreases.

2. The apparatus of claim 1, wherein the speed of the one or more meniscus drag deposition mechanisms is changed to optimize optical characteristics of the nanostructured performance enhancement thin film if the spectrum of the reflected light from the nanostructured performance enhancement thin film shifts relative to the red or infrared side of the light spectrum.

3. The apparatus of claim 1, wherein the first meniscus drag deposition mechanism may be raised or lowered independently of the second meniscus drag deposition mechanism.

4. The apparatus of claim 1, wherein the nanostructured performance enhancement thin film coating is an anti-reflection coating.

5. The apparatus of claim 1, wherein the apparatus further comprises at least one sensor for sensing reflected light from the nanostructured performance enhancement thin film coating after it is deposited on the sloped outdoor panel surfaces.

6. The apparatus of claim 5, wherein the sensor for sensing the reflected light from the nanostructured performance enhancement thin film coating is attached to the meniscus drag coating applicator.

7. The apparatus of claim 5, wherein the sensor for sensing the reflected light from the nanostructured performance enhancement thin film coating is portable, and able to be moved independently of the meniscus drag coating applicator.

* * * * *

UNITED STATES PATENT AND TRADEMARK OFFICE
CERTIFICATE OF CORRECTION

| | | |
|---|---|---|
| PATENT NO. | : 11,302,830 B2 | |
| APPLICATION NO. | : 16/587307 | |
| DATED | : April 12, 2022 | |
| INVENTOR(S) | : John Arthur deVos | |

It is certified that error appears in the above-identified patent and that said Letters Patent is hereby corrected as shown below:

In the Specification

Column 2, Line 66: Replace "coatings To" with --coatings. To--;

Column 3, Line 37: Insert a paragraph break after "single layer.";

Column 3, Line 37: Delete "[0006]";

Column 3, Line 40: Replace "have a" with --have--;

Column 20, Line 24: Delete "means";

Column 27, Line 41: Replace "measurements This" with --measurements. This--;

Column 32, Line 36: Replace "hour,." with --hour.--; and

In the Claims

Column 37, Line 13, Claim 1: Insert sub-paragraph indicator --ii.-- before "at".

Signed and Sealed this
Seventh Day of November, 2023

Katherine Kelly Vidal
*Director of the United States Patent and Trademark Office*